United States Patent
Kawano et al.

(10) Patent No.: US 11,488,998 B2
(45) Date of Patent: Nov. 1, 2022

(54) SEMICONDUCTOR APPARATUS AND EQUIPMENT

(71) Applicant: CANON KABUSHIKI KAISHA, Tokyo (JP)

(72) Inventors: Akihiro Kawano, Yokohama (JP); Yukinobu Suzuki, Koza-gun (JP); Takayasu Kanesada, Yamato (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 219 days.

(21) Appl. No.: 16/853,592

(22) Filed: Apr. 20, 2020

(65) Prior Publication Data
US 2020/0343293 A1    Oct. 29, 2020

(30) Foreign Application Priority Data

Apr. 25, 2019    (JP) .............................. JP2019-084744

(51) Int. Cl.
*H01L 27/146*    (2006.01)
*H01L 23/00*    (2006.01)
(Continued)

(52) U.S. Cl.
CPC .... *H01L 27/14636* (2013.01); *H01L 27/1463* (2013.01); *H01L 27/14612* (2013.01); *H01L 27/14621* (2013.01); *H01L 27/14625* (2013.01); *H01L 27/14627* (2013.01); *H01L 27/14634* (2013.01); *H01L 27/14643* (2013.01); *H01L 27/14683* (2013.01); *H01L 23/481* (2013.01); *H01L 23/485* (2013.01);
(Continued)

(58) Field of Classification Search
CPC ................... H01L 2224/80001; H01L 2224/80894–80896; H01L 2224/0812; H01L 2224/08135; H01L 2224/08145; H01L 2224/08146; H01L 27/14636; H01L 27/14634; H01L 21/76834; H01L 21/76849; H01L 21/76867; H01L 23/481; H01L 23/485; H01L 23/5226; H01L 23/53238; H01L 23/53233
See application file for complete search history.

(56) References Cited

U.S. PATENT DOCUMENTS 8,896,121 B2 * 11/2014 Chapelon ................ H01L 24/05
257/664
2004/0227242 A1    11/2004 Noguchi
(Continued)

FOREIGN PATENT DOCUMENTS

JP    7-230991 A    8/1995
JP    2000-58544 A    2/2000
(Continued)

*Primary Examiner* — David A Zarneke
(74) *Attorney, Agent, or Firm* — Canon U.S.A., Inc. IP Division

(57) ABSTRACT

A semiconductor apparatus configured to decrease occurrence of exfoliation between a conductor layer and an insulator layer is provided. A first region containing silicon and copper is disposed between a first conductor portion and a first insulator portion. A second region containing silicon and copper is disposed between a second conductor portion and a second insulator portion. The first region has a maximum nitrogen concentration higher than that of the second region.

20 Claims, 12 Drawing Sheets

(51) Int. Cl.
*H01L 23/48* (2006.01)
*H01L 23/532* (2006.01)
*H01L 23/485* (2006.01)
*H01L 23/522* (2006.01)

(52) U.S. Cl.
CPC .... *H01L 23/5226* (2013.01); *H01L 23/53233* (2013.01); *H01L 23/53238* (2013.01); *H01L 24/08* (2013.01); *H01L 2224/0812* (2013.01); *H01L 2224/08135* (2013.01); *H01L 2224/08145* (2013.01); *H01L 2224/08146* (2013.01); *H01L 2224/08147* (2013.01); *H01L 2224/80001* (2013.01); *H01L 2224/80894* (2013.01); *H01L 2224/80895* (2013.01); *H01L 2224/80896* (2013.01)

(56) References Cited

U.S. PATENT DOCUMENTS

| | | | |
|---|---|---|---|
| 2010/0025852 A1 | 2/2010 | Ueki | |
| 2012/0319279 A1* | 12/2012 | Isobayashi | H01L 23/53238 438/653 |
| 2013/0307150 A1* | 11/2013 | Edelstein | H01L 21/76883 257/E23.141 |

FOREIGN PATENT DOCUMENTS

| | | |
|---|---|---|
| JP | 2009-117673 A | 5/2009 |
| JP | 2011-124472 A | 6/2011 |
| JP | 2012-256736 A | 12/2012 |
| JP | 2017-188572 A | 10/2017 |

* cited by examiner

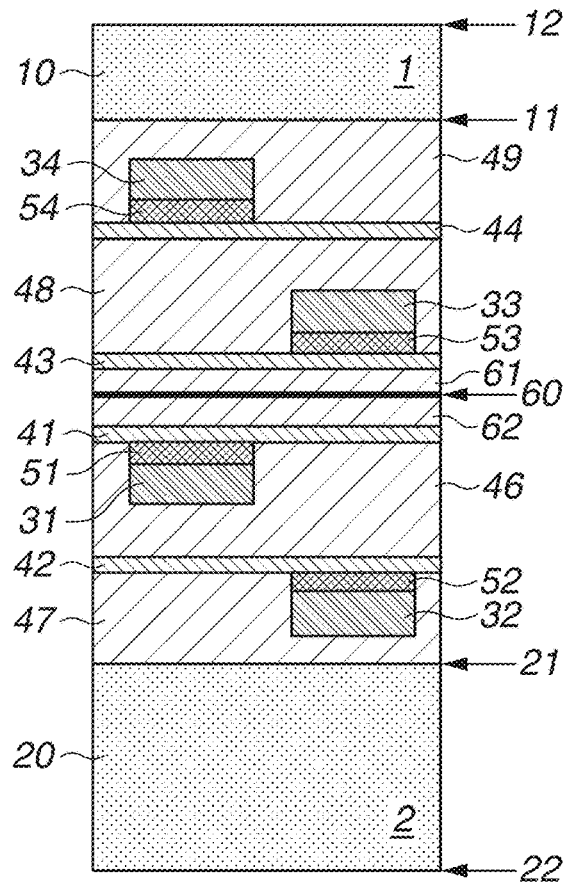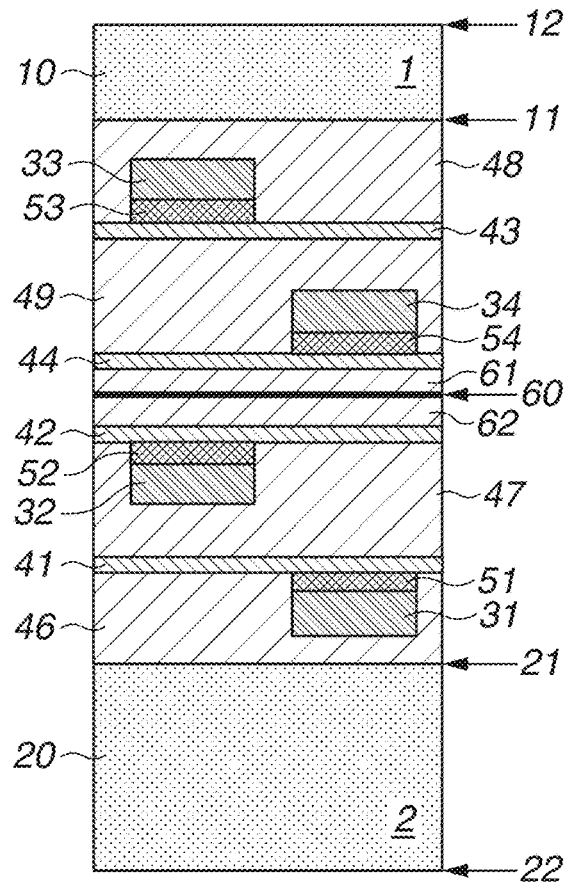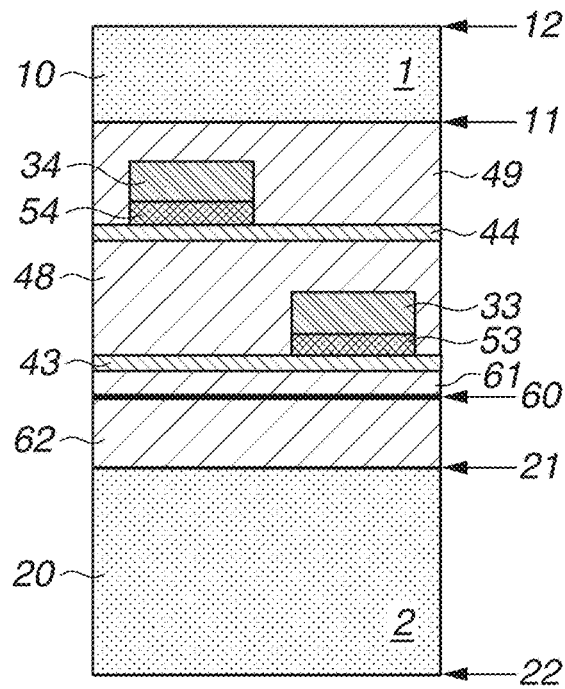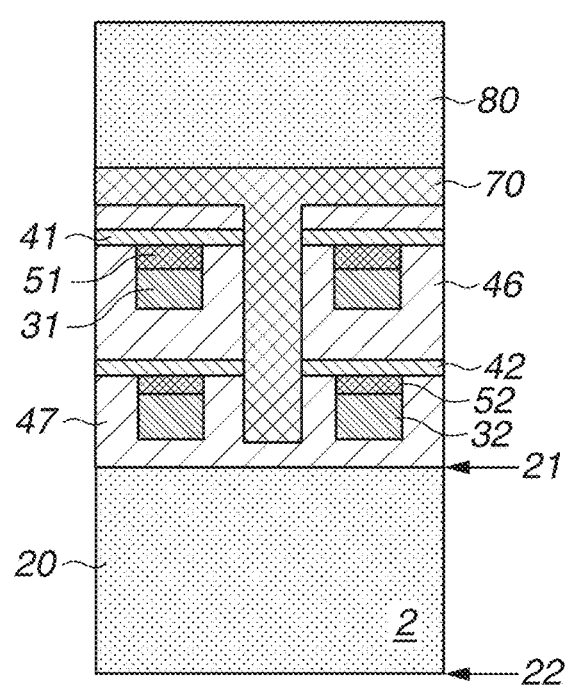

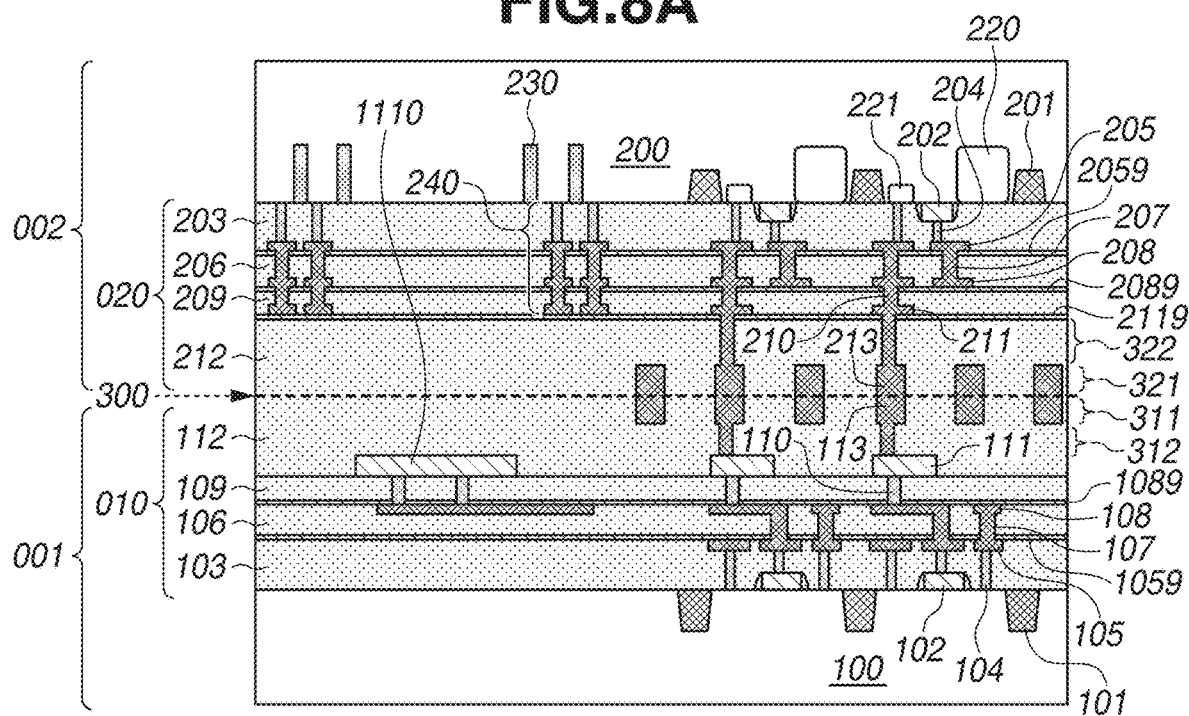
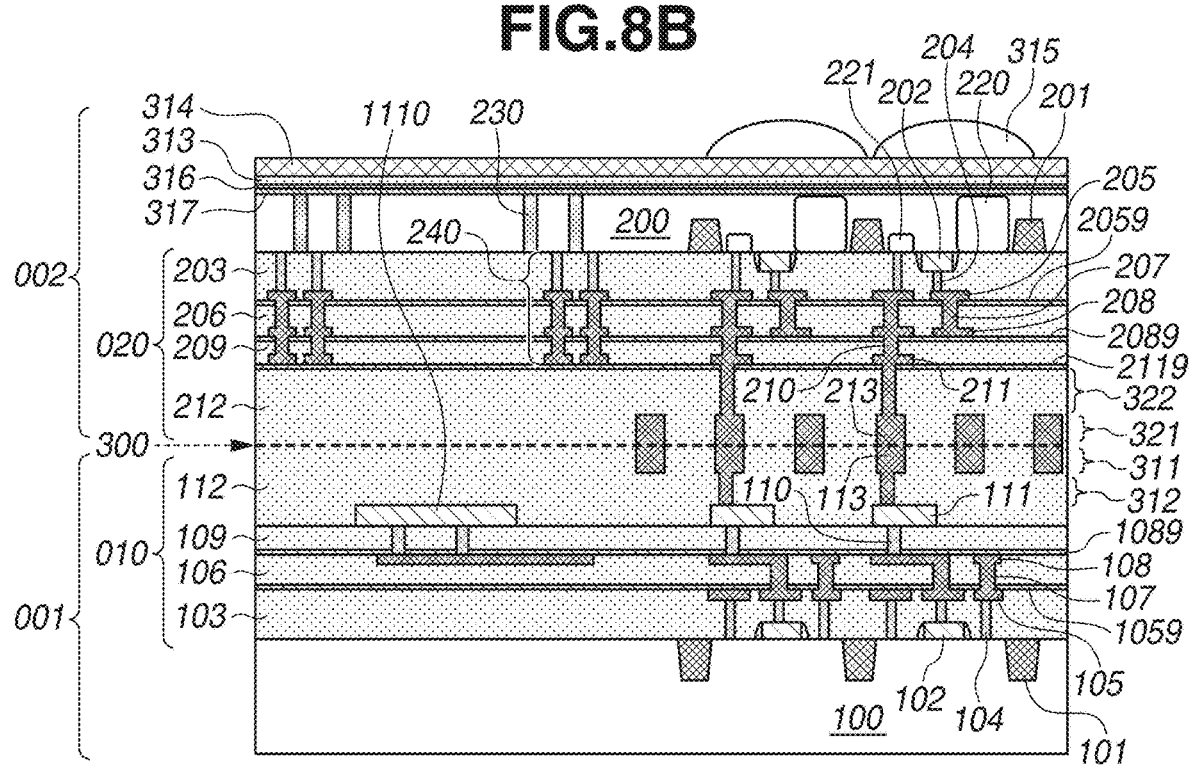

SEMICONDUCTOR APPARATUS AND EQUIPMENT

BACKGROUND OF THE INVENTION

Field of the Invention

The present disclosure relates to a semiconductor apparatus.

Description of the Related Art

In a semiconductor apparatus including a conductor layer containing copper, diffusion of copper is prevented by providing an insulator layer covering the conductor layer.

Japanese Patent Application Laid-Open No. 2012-256736 discusses formation of anti-diffusion films between wiring layers in a semiconductor apparatus formed by bonding semiconductor members to each other.

Japanese Patent Application Laid-Open No. 2017-188572 discusses a photoelectric conversion apparatus including a semiconductor substrate that includes a photoelectric conversion unit, a conductive layer that is formed over the semiconductor substrate, an anti-diffusion layer that is formed over the conductive layer, and a light guide portion that condenses incident light onto the photoelectric conversion unit.

In a semiconductor apparatus discussed in Japanese Patent Application Laid-Open No. 2012-256736, there is a possibility of exfoliation of the anti-diffusion layers from the wiring layers. The photoelectric conversion apparatus discussed in Japanese Patent Application Laid-Open 2017-188572 has room for improvement, whereas the occurrence of film exfoliation between the conductor layer and the anti-diffusion film is reduced.

SUMMARY OF THE INVENTION

According to an aspect of the present disclosure, a semiconductor apparatus includes a semiconductor layer, a substrate, the semiconductor layer and the substrate being stacked on each other, and a first conductor layer, a first insulator layer, a second conductor layer, and a second insulator layer, between the semiconductor layer and the substrate, the first conductor layer containing copper and including a first conductor portion, the first insulator layer covering the first conductor layer and including a first insulator portion, the second conductor layer containing copper and including a second conductor portion, the second insulator layer covering the second conductor layer and including a second insulator portion, wherein a distance between the first conductor portion and the first insulator portion is smaller than a thickness of the first conductor layer, wherein a first region containing silicon and copper is disposed between the first conductor portion and the first insulator portion, wherein a distance between the second conductor portion and the second insulator portion is smaller than a thickness of the second conductor layer, wherein a second region containing silicon and copper is disposed between the second conductor portion and the second insulator portion, and wherein the first region has a maximum nitrogen concentration which is higher than that of the second region.

According to another aspect of the present disclosure, a semiconductor apparatus includes a semiconductor substrate, a dielectric member on the semiconductor substrate, the dielectric member being made of a silicon compound including at least either nitrogen or carbon, and a first conductor layer, a first insulator layer, a second conductor layer, and a second insulator layer, between the semiconductor substrate and the dielectric member, the first conductor layer containing copper and including a first conductor portion, the first insulator layer covering the first conductor layer and including a first insulator portion, the second conductor layer containing copper and including a second conductor portion, the second insulator layer covering the second conductor layer and including a second insulator portion, wherein the dielectric member has an uneven first surface facing toward the semiconductor substrate, wherein a second surface of the dielectric member opposite to the first surface is flatter than the first surface, wherein a distance between the first conductor portion and the first insulator portion is smaller than a thickness of the first conductor layer, and a first region containing silicon and copper is disposed between the first conductor portion and the first insulator portion, wherein a distance between the second conductor portion and the second insulator portion is smaller than a thickness of the second conductor layer, and a second region containing silicon and copper is disposed between the second conductor portion and the second insulator portion, and wherein the first region has a maximum nitrogen concentration which is higher than that of the second region.

Further features of the present disclosure will become apparent from the following description of exemplary embodiments with reference to the attached drawings.

BRIEF DESCRIPTION OF THE DRAWINGS

FIGS. 1A to 1D are schematic sectional views for describing a semiconductor apparatus.

FIGS. 8A and 8B are schematic sectional views for describing the method for manufacturing the semiconductor apparatus according to the first example.

DESCRIPTION OF THE EMBODIMENTS

Figure 2A:
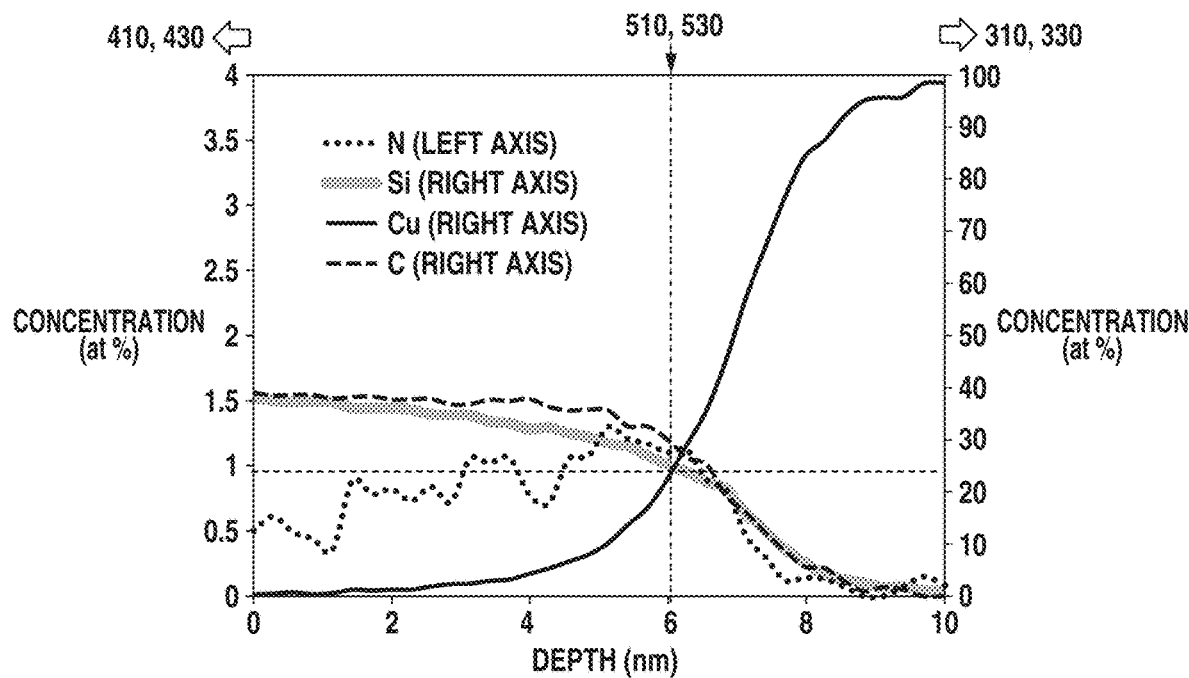
FIGS. 2A and 2B are charts for describing an element profile of intermediate regions.

An exemplary embodiment of the present disclosure is directed to providing a semiconductor apparatus where the occurrence of exfoliation between a conductor layer containing copper and an insulator layer covering the conductor layer is reduced.

According to the present exemplary embodiment, a technique advantageous in reducing the occurrence of exfoliation between conductor layers and insulator layers in a semiconductor apparatus can be provided.

A configuration for carrying out the present disclosure will be described below with reference to the drawings. In the following description and drawings, components common among a plurality of drawings are denoted by the same reference numerals. The common components will thus be described by cross-referring to the plurality of drawings, and a description of the components denoted by the same reference numerals will be omitted as appropriate. Components that have the same names and are denoted by different reference numerals may be distinguished by expressions "nth", for example, a first component, a second component, and a third component, as appropriate.

Figure 11:
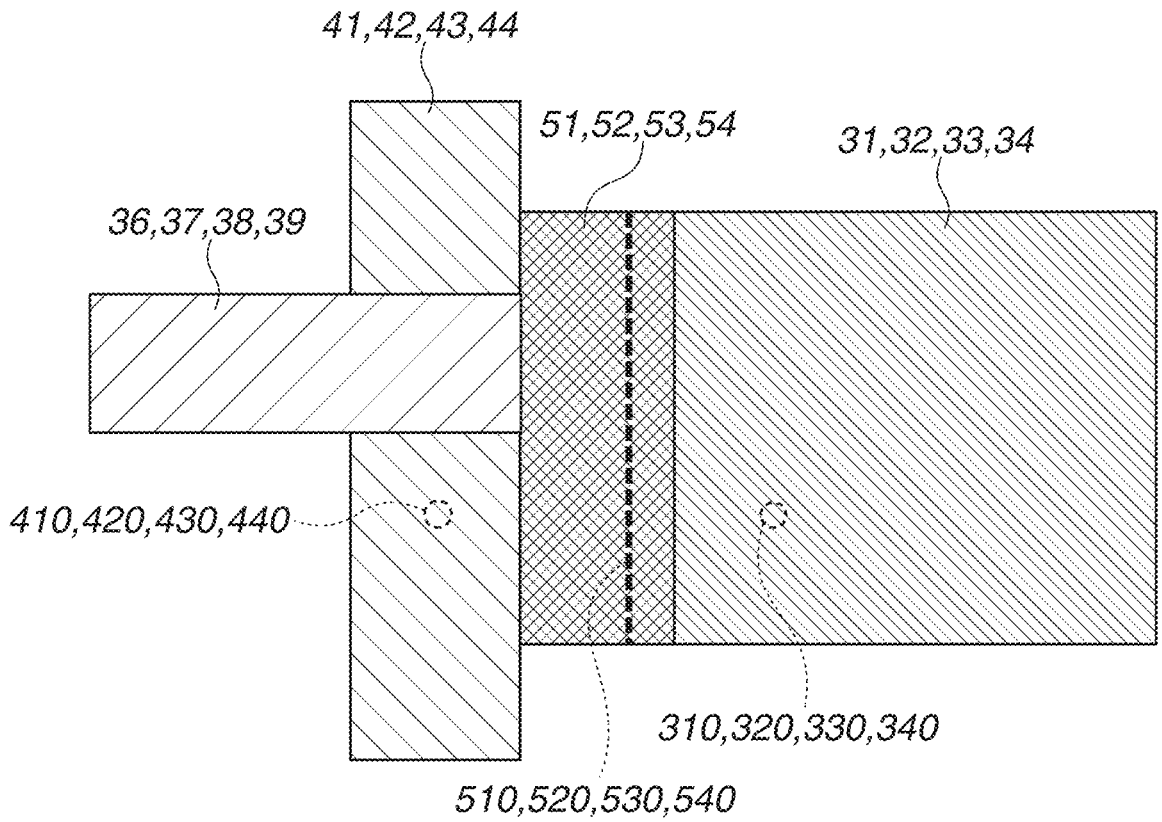
FIG. 11A is a schematic sectional view for describing a semiconductor apparatus.
FIG. 11B is a table illustrating a relationship of nitrogen concentrations.

FIG. 1A is a schematic sectional view according to configuration 1 of a semiconductor apparatus APR. FIG. 1B is a schematic sectional view according to configuration 2 of the semiconductor apparatus APR. FIG. 11A is a partial enlarged view of a cross section of the semiconductor apparatus APR.

The semiconductor apparatus APR includes a semiconductor layer 10 and a substrate 20. The semiconductor layer 10 and the substrate 20 are stacked on each other. A typical semiconductor layer 10 includes semiconductor elements such as a transistor and a diode. The substrate 20 can be a semiconductor substrate including a semiconductor layer. Alternatively, the substrate 20 may be an insulator substrate or a conductor substrate. A typical substrate 20 that is a semiconductor substrate includes semiconductor elements such as a transistor and a diode. The present exemplary embodiment is suitable if the semiconductor layer 10 has a thickness smaller than the substrate 20. For example, the semiconductor layer 10 can have a thickness of 1 to 100 µm. The substrate 20 can have a thickness of 50 to 1000 µm. Alternatively, the substrate 20 may have a thickness of 50 to 500 µm.

The semiconductor apparatus APR includes a conductor layer 31, an insulator layer 41, a conductor layer 32, and an insulator layer 42 between the semiconductor layer 10 and the substrate 20. The conductor layer 31 is mainly made of copper and includes a conductor portion 310. The insulator layer 41 covers the conductor layer 31 and includes an insulator portion 410. The conductor layer 32 is mainly made of copper and includes a conductor portion 320. The insulator layer 42 covers the conductor layer 32 and includes an insulator portion 420.

The semiconductor apparatus APR also includes a conductor layer 33, an insulator layer 43, a conductor layer 34, and an insulator layer 44 between the semiconductor layer 10 and the substrate 20. The conductor layer 33 is mainly made of copper and includes a conductor portion 330. The insulator layer 43 covers the conductor layer 33 and includes an insulator portion 430. The conductor layer 34 is mainly made of copper and includes a conductor portion 340. The insulator layer 44 covers the conductor layer 34 and includes an insulator portion 440.

The semiconductor apparatus APR also includes interlayer insulation layer 46, an interlayer insulation layer 47, and interlayer insulation layer 48, and an interlayer insulation layer 49. The interlayer insulation layers 46, 47, 48, and 49 each have a trench, and the conductor layers 31, 32, 33, and 34 are disposed in the trenches of the interlayer insulation layers 46, 47, 48, and 49, respectively. The conductor layers 31, 32, 33, and 34 thus have a damascene structure.

In the following description, the conductor layers function as wiring layers, and the insulator layers as anti-diffusion layers against copper included in the conductor layers. However, this is not restrictive.

A distance between the conductor portion 310 and the insulator portion 410 is smaller than the thickness of the conductor layer 31. An intermediate region 51 containing silicon and copper is disposed between the conductor portion 310 and the insulator portion 410. A distance between the conductor portion 320 and the insulator portion 420 is smaller than the thickness of the conductor layer 32. An intermediate region 52 containing silicon and copper is disposed between the conductor portion 320 and the insulator portion 420.

A distance between the conductor portion 330 and the insulator portion 430 is smaller than the thickness of the conductor layer 33. An intermediate region 53 containing silicon and copper is disposed between the conductor portion 330 and the insulator portion 430. A distance between the conductor portion 340 and the insulator portion 440 is smaller than the thickness of the conductor layer 34. An intermediate region 54 containing silicon and copper is disposed between the conductor portion 340 and the insulator portion 440.

If the foregoing distances between the conductor portions 310, 320, 330, and 340 and the insulator portions 410, 420, 430, and 440 are satisfied, it can be said that the conductor portions 310, 320, 330, and 340 and the insulator portions 410, 420, 430, and 440 are adjacent to each other. Similarly, if the distances between the conductor portions 310, 320, 330, and 340 and the insulator portions 410, 420, 430, and 440 are satisfied, it can be said that the conductor layers 31, 32, 33, and 34 and the insulator layers 41, 42, 43, and 44 are adjacent to each other.

The thicknesses of the insulator layers 41, 42, 43, and 44 may be smaller than those of the conductor layers 31, 32, 33, and 34 adjacent to the insulator layers 41, 42, 43, and 44. The distance between conductor portion 310 and the insulator portion 410 may be smaller than the thickness of the insulator layer 41. The distance between conductor portion 320 and the insulator portion 420 may be smaller than the thickness of the insulator layer 42. The distance between conductor portion 330 and the insulator portion 430 may be smaller than the thickness of the insulator layer 43. The distance between conductor portion 340 and the insulator portion 440 may be smaller than the thickness of the insulator layer 44.

As illustrated in FIG. 11A though not illustrated in FIG. 1A or 1B, a plug 36 is connected to the conductor layer 31 through the insulator layer 41 adjacent to the conductor layer 31. A plug 37 is connected to the conductor layer 32 through the insulator layer 42 adjacent to the conductor layer 32. A plug 38 is connected to the conductor layer 33 through the insulator layer 43 adjacent to the conductor layer 33. A plug 39 is connected to the conductor layer 34 through the insulator layer 44 adjacent to the conductor layer 34. The plugs 36, 37, 38, and 39 are conductive members electrically connected to the conductor layers 31, 32, 33, and 34, and are in contact with the intermediate regions 51, 52, 53, and 54. In other words, the conductive members (plugs 36, 37, 38, and 39) are electrically connected to the conductor layers 31, 32, 33, and 34 via the intermediate regions 51, 52, 53, and 54. The plugs 36, 37, 38, and 39 can include a conductor layer having a dual damascene structure. For example, in FIG. 1A, the plug 37 connected to the conductor layer 32 can include the conductor layer 31 having a dual damascene structure. Similarly, the plug 39 connected to the conductor layer 34 can include the conductor layer 33 having a dual damascene structure. The plugs 36 and 38 are dispensable. The conductive portions of the plugs 36 and 38 connected to the conductor layers 31 and 33 may be made of a material different from the conductive portions of the plugs 37 and 39 connected to the conductor layers 32 and 34. For example, the material of the conductive portions of the plugs 36 and 38 connected to the conductor layers 31 and 33 may be tungsten, and the material of the conductive portions of plugs 37 and 39 connected to the conductor layers 32 and 34 may be copper. The plugs 36, 37, 38, and 39 may include barrier metal portions around the conductor portions that are main portions. The barrier metal portions are made of a metal or metal compound such as titanium, titanium nitride, titanium carbide, tantalum, tantalum nitride, and tantalum carbide. The barrier metal portions of the plugs 36, 37, 38, and 39 are interposed between the conductive portions of the plugs 36, 37, 38, and 39 and the interlayer insulation layers 46, 47, 48, and 49, and between the conductive portions of the plugs 36, 37, 38, and 39 and the insulator layers 41, 42, 43, and 44. The barrier metal portions of the plugs 36, 37, 38, and 39 are interposed between the conductive portions of the plugs 36, 37, 38, and 39 and the conductor layers 31, 32, 33, and 34. As described above, the plugs 36, 37, 38, and 39 are in contact with the intermediate regions 51, 52, 53, and 54. More specifically, the barrier metal portions of the plugs 36, 37, 38, and 39 can contact the intermediate regions 51, 52, 53, and 54. The barrier metal portions of the plugs 36, 37, 38, and 39 are disposed between the conductive portions of the plugs 36, 37, 38, and 39 and the intermediate regions 51, 52, 53, and 54.

The semiconductor apparatus APR according to the present exemplary embodiment includes a part 1 including the semiconductor layer 10, a bonding member 61, a structure (wiring structure) between the bonding member 61 and the semiconductor layer 10. The semiconductor apparatus APR also includes a part 2 including the substrate 20, a bonding member 62, and a structure (wiring structure) between the bonding member 62 and the substrate 20. The parts 1 and 2 are bonded by the bonding members 61 and 62.

The bonding members 61 and 62 may be bonded by using an adhesive, by direct bonding of insulators, by direct bonding of conductors, and by coexistence (hybrid bonding) of direct bonding of insulators and direct bonding of conductors in a bonding surface 60. The conductor layers 31 and 32 of the part 2 and the conductor layers 33 and 34 of the part 1 may be electrically connected by electrical connection means. Examples of the electrical connection means include electrodes passing through the semiconductor layer 10 and/or the substrate 20, direct bonding of patterned conductors, and bumps.

Functions of the parts 1 and 2 are not particularly limited. Either one of the parts 1 and 2 may include an analog circuit, and the other may include a digital circuit. Either one of the parts 1 and 2 may include a memory and a sensor, and the other a processor and a controller. Either one of the parts 1 and 2 may include a memory, and the other a sensor. Either one of the parts 1 and 2 may include a processor, and the other a controller. The part 2 may be a support member or a wiring member such as an interposer. Metal-oxide-semiconductor (MOS) transistors included in the substrate 20 may have a gate length smaller than MOS transistors included in the semiconductor layer 10. MOS transistors included in the substrate 20 may include a gate insulation film thinner than MOS transistors included in the semiconductor layer 10. At least one of the semiconductor layer 10 and the substrate 20 may include a photoelectric conversion unit such as a photodiode.

Figure 2B:
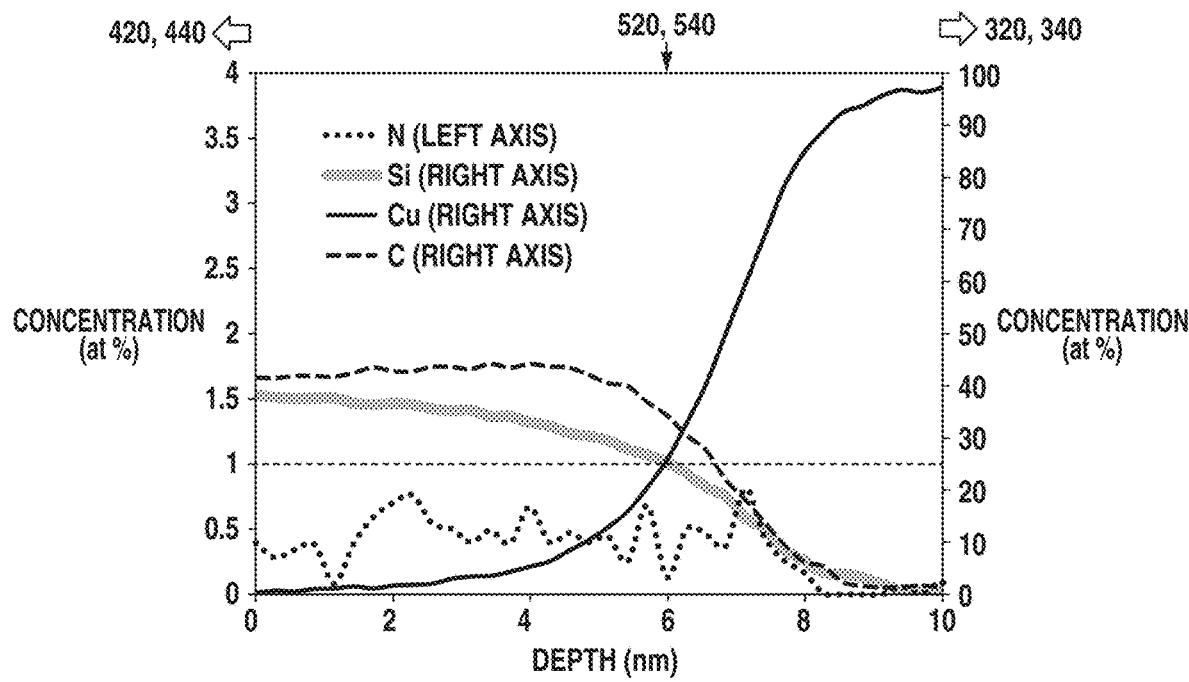

FIG. 2A illustrates a concentration distribution of elements constituting the intermediate region 51 or 53. FIG. 2B illustrates a concentration distribution of elements constituting the intermediate region 52 or 54. The element concentration distributions illustrated in FIGS. 2A and 2B were measured by X-ray photoelectron spectroscopy (XPS), whereas secondary ion mass spectrometry (SIMS) or energy dispersive X-ray spectroscopy (EDX) may be used for measurement. The element concentration distributions here indicate the concentrations of silicon (Si), nitrogen (N), carbon (C), and copper (Cu). The elements included in the intermediate regions 51, 52, 53, and 54 can be mostly silicon (Si), nitrogen (N), carbon (C), and copper (Cu), whereas other elements such as hydrogen (H), oxygen (O), fluorine (F), chlorine (Cl), argon (Ar), and metals may be included. Examples of the metal elements that can be included in the intermediate regions 51, 52, 53, and 54 other than copper are ones that can also be included in the plugs 36, 37, 38, and 39. Examples include titanium (Ti) and tantalum (Ta).

The intermediate region 51 has a maximum nitrogen concentration higher than that of the intermediate region 52. The intermediate region 53 has a maximum nitrogen concentration higher than that of the intermediate region 54. The maximum nitrogen concentration of the intermediate region 51 is higher than that of the intermediate region 54. The maximum nitrogen concentration of the intermediate region 53 is higher than that of the intermediate region 52. The conductor layers 31 and 33 and the insulator layers 41 and 43 are thus arranged across the intermediate regions 51 and 53 having a relatively high maximum nitrogen concentration. The conductor layers 32 and 34 and the insulator layers 42 and 44 are arranged across the intermediate regions 52 and 54 having a relatively low maximum nitrogen concentration. If such a relationship between the maximum nitrogen concentrations is satisfied, the adhesion between the conductor layers 31 and 33 and the insulator layers 41 and 43 becomes higher than that between the conductor layers 32 and 34 and the insulator layers 42 and 44. Moreover, if the relationship between the maximum nitrogen concentrations is satisfied, connection resistances between the conductor layers 32 and 34 and the plugs 37 and 39 become lower than those between the conductor layers 31 and 33 and the plugs 36 and 38. The present exemplary embodiment is characterized by use of such a relationship of the maximum nitrogen concentrations with the adhesion and the connection resistances.

To increase the adhesion of all the conductor layers 31, 32, 33, and 34 to the adjacent insulator layers 41, 42, 43, and 44, the nitrogen concentrations of the intermediate regions 51, 52, 53, and 54 accompanying all the conductor layers 31, 32, 33, and 34 can be similarly increased. This, however, increases the connection resistances as described above, and the performance of the semiconductor apparatus APR drops due to increased wiring resistances. To reduce the connection resistances of all the conductor layers 31, 32, 33, and 34 connected to the plugs 36, 37, 38, and 39, the nitrogen concentrations of the intermediate regions 51, 52, 53, and 54 accompanying all the conductor layers 31, 32, 33, and 34 can be similarly reduced. This method, however, lowers the adhesion as described above, which drops the reliability of the semiconductor apparatus APR. For such a reason, the maximum nitrogen concentrations of intermediate regions accompanying the conductor layers, which are suitable for increase of the adhesion is desirably made higher than those of intermediate regions accompanying the conductor layers, which are suitable for reduction of the connection resistance.

In configuration 1, the distance between the semiconductor layer 10 and the conductor layer 31 is smaller than that between the semiconductor layer 10 and the conductor layer 32. In the configuration 1, the distance between the substrate 20 and the conductor layer 31 is greater than that between the substrate 20 and the conductor layer 32. In the configuration 1, the distance between the semiconductor layer 10 and the conductor layer 33 is greater than that between the semiconductor layer 10 and the conductor layer 34. In the configuration 1, the distance between the substrate 20 and the conductor layer 33 is smaller than that between the substrate 20 and the conductor layer 34. In the configuration 1, the distance between the semiconductor layer 10 and the conductor layer 31 and the distance between the semiconductor layer 10 and the conductor layer 32 are greater than a distance between the semiconductor layer 10 and the conductor layer 33, and a distance between the semiconductor layer 10 and the conductor layer 34. In the configuration 1, the distance between the substrate 20 and the conductor layer 31 and the distance between the substrate 20 and the conductor layer 32 are smaller than the distance between the substrate 20 and the conductor layer 33 and the distance between the substrate 20 and the conductor layer 34.

For example, the bonding surface 60 is prone to stress, and exfoliation is likely to occur between conductor layers and insulator layers near the bonding surface 60. In the configuration 1 illustrated in FIG. 1A, between the bonding surface 60 and the substrate 20, the intermediate region 51 accompanying the conductor layer 31 which is closer to the bonding surface 60 than the conductor layer 32 has a maximum nitrogen concentration higher than the intermediate region 52 accompanying the conductor layer 32. Between the bonding surface 60 and the semiconductor layer 10, the intermediate region 53 accompanying the conductor layer 33 which is closer to the bonding surface 60 than the conductor layer 34, has a maximum nitrogen concentration which is higher than the intermediate region 54 accompanying the conductor layer 34. This can reduce exfoliation between the conductor layers near the bonding surface 60 and the adjacent insulator layers. In bonding the parts 1 and 2 via such a bonding surface 60, the surfaces of the parts 1 and 2 to be bonded (bonding surfaces) are flattened by polishing. Force can also be applied by the polishing, but the exfoliation between the conductor layers near the bonding surfaces and the adjacent insulator layers during the polishing can be reduced since the maximum nitrogen concentrations of the intermediate regions 51 and 53 are higher than the intermediate regions 52 and 54.

A surface 11 of the semiconductor layer 10 and a surface 21 of the substrate 20 form interfaces with the insulators and conductors constituting the wiring structures. Stress is therefore likely to occur near the surfaces 11 and 21 of the semiconductor layer 10 and the substrate 20. This can cause the exfoliation between the conductor layers and the insulator layers near the surfaces 11 and 21 of the semiconductor layer 10 and the substrate 20. In configuration 2 illustrated in FIG. 1B, the part 2 is thus configured such that the intermediate region 51 accompanying the conductor layer 31 which is closer to the surface 21 than the conductor layer 32 has a maximum nitrogen concentration which is higher than the intermediate region 52 accompanying the conductor layer 32. The part 1 is configured such that the intermediate region 53 accompanying the conductor layer 33 which is closer to the surface 11 than the conductor layer 34 has a maximum nitrogen concentration higher than the intermediate region 54 accompanying the conductor layer 34. This can reduce the exfoliation between the conductor layers near the surfaces 11 and 21 and the adjacent insulator layers. In a case where the semiconductor layer 10 and the substrate 20 are thinned to a predetermined thickness, backsides 12 and 22 of the semiconductor layer 10 and the substrate 20 of the parts 1 and 2 are thinned by polishing. Although the substrate 20 does not necessarily need to be thinned, the substrate 20, if thinned, has a thickness of around 50 to 500 μm. Force can also be applied by the polishing, but the exfoliation between the conductor layers near the backsides 12 and 22 and the adjacent insulator layers during the polishing can be reduced since the maximum nitrogen concentrations of the intermediate regions 51 and 53 are higher than the intermediate regions 52 and 54.

FIG. 11B illustrates a relationship among the maximum nitrogen concentrations of intermediate regions A, B, C, and D in configurations 1 to 10. The intermediate regions A, B, C, and D each correspond to any one of the intermediate regions 51, 52, 53, and 54. The distance from the semiconductor layer 10 increases in order of the intermediate region A, the intermediate region B, the intermediate region C, and the intermediate region D. In other words, the distance from the substrate 20 increases in order of the intermediate region D, the intermediate region C, the intermediate region B, and the intermediate region A. The bonding surface 60 is disposed between the intermediate regions C and B. Regions where the maximum nitrogen concentration is "high" correspond to the intermediate regions 51 and 53. Regions where the maximum nitrogen concentration is "low" correspond to the intermediate regions 52 and 54. The regions where the maximum nitrogen concentration is "high" may have maximum nitrogen concentrations different from each other. The regions where the maximum nitrogen concentration is "low" may have maximum nitrogen concentrations different from each other. In configuration 1, as described above, the intermediate regions A and D correspond to the intermediate regions 54 and 52, and the intermediate regions B and C correspond to the intermediate regions 53 and 51. In the configuration 2, as described above, the intermediate regions A and D correspond to the intermediate regions 53 and 51, and the intermediate regions B and C correspond to the intermediate regions 54 and 52. In other words, in the configuration 2, the distance between the semiconductor layer 10 and the conductor layer 31 is greater than that between the semiconductor layer 10 and the conductor layer 32.

Configuration 3 corresponds to a combination of the part 2 according to the configuration 1 and the part 1 according to the configuration 1. Since the semiconductor layer 10 is thinner than the substrate 20, portions closer to the semiconductor layer 10 are more susceptible to stress. The part 1 is thus configured to increase the adhesion between the conductor layer near the surface 11 of the semiconductor layer 10 and the adjacent insulator layer by taking into account the stress near the surface 11 of the semiconductor layer 10 and the stress occurring in thinning the semiconductor layer 10. On the other hand, the part 2 is configured to increase the adhesion of the insulator layer near the bonding surface 60 as the configuration 1 by taking into account the stress from the bonding surface 60.

Configuration 4 corresponds to a combination of the part 1 according to the configuration 1 and the part 2 according to the configuration 2. If the temperature of the substrate 20 is likely to be higher than the semiconductor layer 10 during use of the semiconductor apparatus APR, stress is likely to occur near the surface 21 of the substrate 20. The part 2 is therefore configured to increase the adhesion between the conductor layer near the surface 21 of the substrate 20 and the adjacent insulator layer. On the other hand, the part 1 is configured to increase the adhesion between the conductor layer near the bonding surface 60 and the insulator layer as the configuration 1 by taking into account the stress from the bonding surface 60.

In configuration 5, intermediate regions having a relatively high maximum nitrogen concentration are applied to the plurality of conductor layers in the part 2. If the temperature of the substrate 20 is likely to be higher than the semiconductor layer 10 during use of the semiconductor apparatus APR, stress is likely to occur in the part 2. The part 2 is, therefore, configured to increase the adhesion between the plurality of conductor layers and the adjacent insulator layers. Meanwhile, intermediate regions having a relatively low maximum nitrogen concentration are applied to the plurality of conductor layers in the part 1. This can suppress an increase in the wiring resistance between the semiconductor layer 10 and the substrate 20.

In configuration 6, intermediate regions having a relatively low maximum nitrogen concentration are applied to the plurality of conductor layers in the part 2. This method reduces the contact resistances between the plugs and the conductor layers, which reduces the wiring resistance in the part 2. Resistance-capacitance (RC) delay in the wiring structure of the part 2 can thereby be reduced to achieve high-speed operation of the part 2. Since the part 1 includes the semiconductor layer 10, which is thinner than the substrate 20, intermediate regions having a relatively high maximum nitrogen concentration are applied to the plurality of conductor layers of the part 1 to increase adhesion.

Intermediate regions accompanying the conductor layers in which the maximum nitrogen concentration is to be increased, and intermediate regions accompanying the conductor layers in which the maximum nitrogen concentration is to be reduced, can be determined based on the distances from the conductor layers to the bonding surface 60, the surfaces 11 and 21, and the backsides 12 and 22. Of these surfaces, the distances to the bonding surface 60 and the backsides 12 and 22 that have the polished surfaces are more desirably used for the determination. In the part 1, a conductor layer closest to either the bonding surface 60 or the backside 12 needs to be identified, and the maximum nitrogen concentration of the intermediate region accompanying the conductor layer needs to be made higher than that of the intermediate region accompanying other conductor layers. In the part 2, a conductor layer closest to either the bonding surface 60 or the backside 22 needs to be identified, and the maximum nitrogen concentration of the intermediate region accompanying the conductor layer needs to be made higher than that of the intermediate layer accompanying other conductor layers. For example, in the configuration 1, if the distance between the semiconductor layer 10 and the conductor layer 31 is smaller than the thickness of the semiconductor layer 10, the distance between the conductor layer 31 and the bonding surface 60 can be smaller than that between the conductor layer 31 and the backside 12.

To increase the adhesion between the conductor layers 31 and 33 and the insulator layers 41 and 43, nitrogen and silicon are desirably bonded in the intermediate regions 51 and 53. To increase the adhesion between the conductor layers 31 and 33 and the insulator layers 41 and 43, copper and silicon are desirably bonded in the intermediate regions 51 and 53.

The insulator layers 41, 42, 43, and 44 contain silicon. Typically, the insulator layers 41, 42, 43, and 44 are silicon compound layers. The insulator layers 41, 42, 43, and 44 contain carbon. The insulator layers 41 43 and the insulator layers 42, 44 are silicon carbide layers. The silicon carbide constituting the insulating layers 41 43 and the layers 42, 44 may contain elements other than silicon and carbon. For example, the silicon carbide can contain oxygen and/or nitrogen. The insulator layers 41, 43 and the insulator layers 42, 44 are, for example, SiC, SiCN, and SiCO layers. The insulator layers 41, 43 and the insulator layers 42, 44 may be silicon nitride layers.

The maximum nitrogen concentrations of the intermediate regions 51 and 53 are desirably higher than the nitrogen concentrations of the conductor portions 310 and 330 because if nitrogen concentrations of the conductive portions 310 and 330 are extremely high, resistance of the conductor layers 31 and 32 is increased. The maximum nitrogen concentrations of the intermediate regions 51 and 53 may be higher than the nitrogen concentrations of the insulator portions 410 and 430 because if nitrogen concentrations of the insulator portions 410 and 430 are extremely high, permittivity of the insulator layers 41 and 43 becomes high and wiring capacitances are increased.

The intermediate region 51 can include an interface portion 510 where the silicon concentration and the copper concentration are equal. The intermediate region 52 can include an interface portion 520 where the silicon concentration and the copper concentration are equal. The intermediate region 53 can include an interface portion 530 where the silicon concentration and the copper concentration are equal. The intermediate region 54 can include an interface portion 540 where the silicon concentration and the copper concentration are equal. To increase the adhesion between the conductor layers 31, 33 and the insulator layers 41, 43, the nitrogen concentrations of the interface portions 510 and 530 are desirably higher than those of the interface portions 520 and 540. To reduce the connection resistances between the conductor layers 31, 33 and the plugs 36, 37, the nitrogen concentrations of the interface portions 510, 530 are desirably lower than the silicon concentrations of the interface portions 510, 530 and the copper concentrations of the interface portions 510, 530. The intermediate regions 51 and 53 can have a maximum nitrogen concentration of 1.0 at % or more and less than 10 at %. The intermediate regions 52 and 54 can have a maximum nitrogen concentration of less than 1.0 at %. The intermediate regions 52 and 54 may be nitrogen-free, in which case the maximum nitrogen concentrations of the intermediate regions 52 and 54 are 0 at %.

FIG. 1C is a schematic sectional view related to configuration 7 of the semiconductor apparatus APR. In the configuration 7, there is no conductor layer between the bonding surface 60 and the substrate 20. In such a case, for example, the substrate 20 is used as a support substrate for supporting the semiconductor layer 10, and the substrate 20 does not necessarily need to include a semiconductor layer. The bonding surface of the part 1 is used as a bonding surface 60 with the part 2, which includes the substrate 20 serving as a support substrate and the bonding member 62. The configuration 7 satisfies the relationship between the maximum nitrogen concentrations of the intermediate regions A and B in the configurations 1 and 4. Specifically, as illustrated in FIG. 1C, the conductor layer 33 accompanying the intermediate region 53 which has a relatively low maximum nitrogen concentration, and the insulating layer 43, are disposed farther from the semiconductor layer 10 and closer to the substrate 20 than the conductor layer 34 accompanying the intermediate region 54 which has a relatively low maximum nitrogen concentration and the insulator layer 44. Configuration 8 is a modification of the configuration 7, and satisfies the relationship between the maximum nitrogen concentrations of the intermediate regions A and B in the configurations 2 and 3. If higher priority is given to the flattening of the bonding surface 60, the configuration 7 satisfying the same relationship as that between the maximum nitrogen concentrations of the intermediate regions A and B in the configurations 1 and 4 is desirable compared to the configuration 8. In the configuration illustrated in FIG. 1C, the distances of the conductor layer 33 accompanying the intermediate region 53 and the insulator layer 43, from the bonding surface 60 are smaller than those of the conductor layer 34 accompanying the intermediate region 54 and the insulator layer 44, from the backside 12. Therefore, higher priority is desirably given to the flattening of the bonding member 60. If higher priority is to be given to the polishing of the backside 20, the distances of the conductor layer 33 accompanying the intermediate region 53 and the insulator layer 43 from the backside 12 needs to be made smaller than those of the conductor layer 34 accompanying the intermediate region 54 and the insulator layer 44, from the bonding surface 60. FIG. 1D is a schematic sectional view related to configuration 9 of the semiconductor apparatus APR. The configuration 9 includes, as an example, a configuration that does not includes the bonding surface 60 or the part 1. While in the foregoing description the bonding surface 60 is described which is a polished surface flattened by polishing, such a polished surface is not applied to only the bonding surface 60. The semiconductor apparatus APR based on the configuration 9 is provided with a dielectric member 70 over the substrate 20 that is a semiconductor substrate. The dielectric member 70 is made of a silicon compound including at least either nitrogen or oxygen (e.g., silicon nitride or silicon carbide). The conductor layers 31, 32 and the insulator layers 41, 42 are disposed between the substrate 20 and the dielectric member 70. The distance between the substrate 20 and the conductor layer 31 is greater than that between the substrate 20 and the conductor layer 32. The dielectric member 70 has an uneven bottom surface (a concave and convex surface) which faces toward the substrate 20. The uneven bottom surface may be formed by a concaves and convexes. A top surface of the dielectric member 70 opposite to the bottom surface is flatter than the bottom surface. For example, a difference in height of the top surface of the dielectric member 70 can be less than 1/10 of the bottom surface. The distance between the top surface of the dielectric member 70 and the conductor layer 31 is smaller than that between the top surface of the dielectric member 70 and the conductor layer 32. The dielectric member 70 includes a portion surrounded by the insulator layer 41 and the interlayer insulation layer 46. The dielectric member 70 may further include a portion surrounded by the insulator layer 42 and the interlayer insulation layer 47. In the present example, the dielectric member 70 has the uneven bottom surface because the insulator films underlying the dielectric member 70 (the insulator layer 41, the interlayer insulation layer 46, the insulator layer 42, and the interlayer insulation layer 47) have holes. The holes may correspond to the convexes of the dielectric member 70. The configuration where the dielectric member 70 has an uneven bottom surface (a concave and convex surface) is not limited thereto, and the dielectric member 70 may have an uneven bottom surface because unevenness formed by aluminum wiring is covered by the dielectric member 70 serving as a passivation film.

To form a flat top surface on the dielectric member 70, for example, the top surface of the dielectric member 70 over the substrate 20 can be flattened by polishing. Stress that can occur during the polishing can cause exfoliation of a conductor layer and an adjacent insulator layer, between the dielectric member 70 and the substrate 20. Therefore, intermediate regions 51 having a relatively high maximum nitrogen concentration are disposed between the conductor portions 310 of the conductor layer 31 and the insulator portions 410 of the insulator layer 41 adjacent to the conductor layer 31, whereby exfoliation can be reduced. On the other hand, the conductor layer 32 which is disposed farther from the dielectric member 70 than the conductor layer 31 is less likely to exfoliate from the insulator layer 42 compared with the conductor layer 31. Therefore, intermediate regions 52 having a relatively low maximum nitrogen concentration are disposed between the conductor portions 320 of the conductor layer 32 and the insulator portions 420 of the insulator layer 42 adjacent to the conductor layer 32, whereby an increase in wiring resistance can be suppressed. Configuration 10 is a modification of the configuration 9, and satisfies the relationship between the maximum nitrogen concentrations of the intermediate regions A and B based on the configurations 2 and 4. In other words, the distance between the top surface of the dielectric member 70 and the conductor layer 31 is greater than the distance between the top surface of the dielectric member 70 and the conductor layer 32. This can reduce exfoliation between the conductor layer 32 and the insulator layer 42 due to stress that can occur near the substrate 20. However, if higher priority is given to the flattening of the top surface of the dielectric member 70, the configuration 9 satisfying the same relationship as that between the maximum nitrogen concentrations of the intermediate regions C and D based on the configurations 1 and 3 is desirable compared to the configuration 10.

Figure 3A:
FIGS. 3A to 3E are schematic sectional views for describing a method for forming intermediate regions.
Figure 3B:
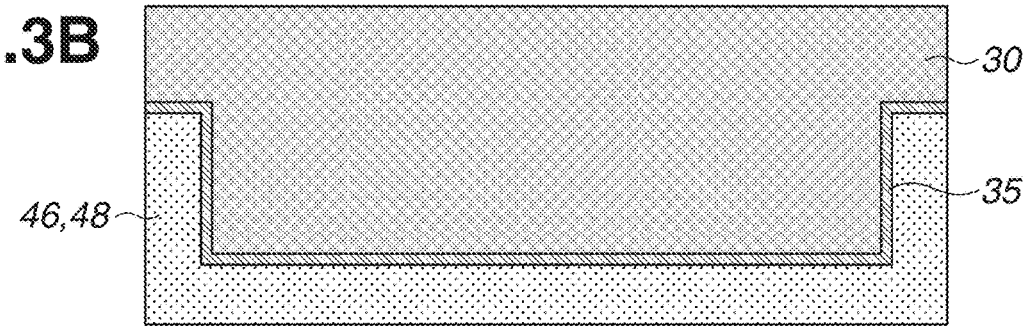
Figure 3C:
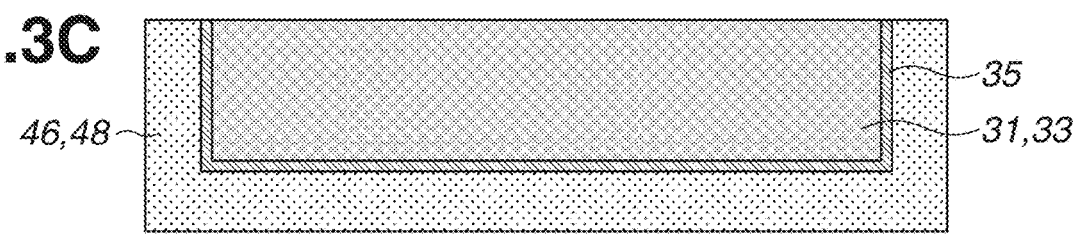
Figure 3D:
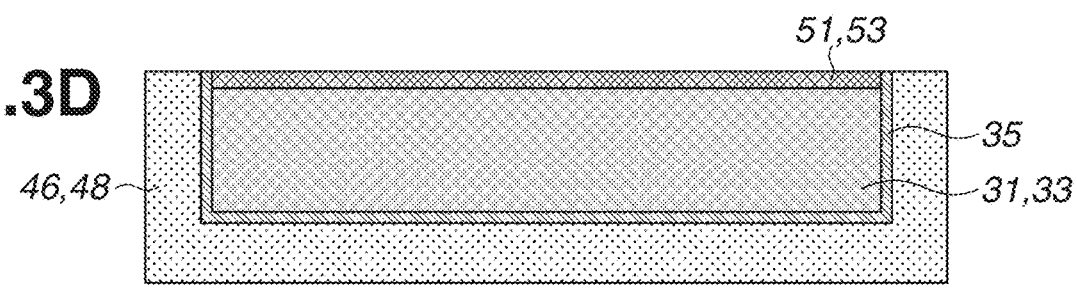
Figure 3E:
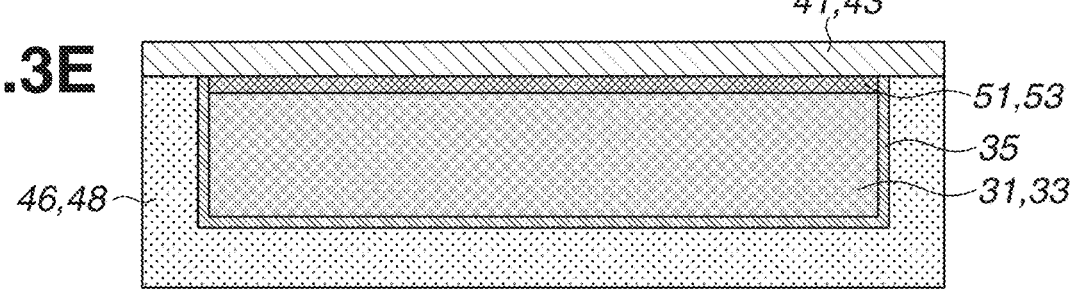

A method for forming the intermediate regions 51, 52, 53, and 54 will be described with reference to FIGS. 3A to 3E. As illustrated in FIG. 3A, a trench 1080 is formed in the interlayer insulation layers 46 and 48 by etching. Next, as illustrated in FIG. 3B, a barrier metal film 35 made of Ta, Ti, TaN, or TiN is formed as a conductive anti-diffusion material (barrier metal) against copper through physical vapor deposition (PVD) or chemical vapor deposition (CVD). Next, as a material of conductor layers, a conductor film 30 mainly made of copper is formed on the barrier metal film 35 by electrolytic plating. Next, as illustrated in FIG. 3C, portions of the conductor film 30 and the barrier metal film 35 lying outside the trench 1080 are removed through chemical mechanical polishing (CMP). The conductor layers 31 and 33 mainly made of copper are thereby formed. Next, the surfaces of the conductor layers 31 and 33 are doped with silicon. To that end, the conductor layers 31 and 33 (and the interlayer insulation layer 46) are exposed to a silicon-containing gas such as silane gas. In this case, the interlayer insulation layer 46 does not react, and silicon can be selectively doped into the surface of the conductor layers 31 and 33 mainly made of copper. Next, the conductor layers 31 and 33 (and the interlayer insulation layer 46) are exposed to the plasma of a nitrogen-containing gas such as a mixed gas of nitrogen or ammonium. As a result, the nitrogen in the plasma and the silicon doped into the conductor layers 31 and 33 react to produce an Si—N bond. Nitrogen can thereby be doped into copper. Such advance doping of silicon enables efficient nitridization of copper. Next, the insulator layers 41 and 43 are formed as illustrated in FIG. 3E. For the insulator layers 41 and 43, a low permittivity material is desirably selected by taking into account inter-line capacitances as well as copper diffusion resistance. Besides, a low stress material is desirably selected because of concern about stress migration. For example, carbon-containing silicon compounds such as SiC and SiCN, and SiN are appropriate. The presence of the intermediate regions 51 and 53 having a high nitrogen concentration near the interfaces between the insulator layers 41 and 43 and the conductor layers 31 and 33 improves the adhesion between the insulator layers 41, 43 and the conductor layers 31, 33.

The intermediate regions 52 and 54 can be formed to have a maximum nitrogen concentration which is lower than that of the intermediate regions 51 and 53 by forming the conductor layers 32 and 34 as illustrated in FIGS. 3A, 3B, and 3C, and then doping no silicon or nitrogen. The mixed regions of silicon and copper in the intermediate regions 52 and 54 can be formed through diffusion of copper in the conductor layers 32 and 34 into part of the insulator layers 42 and 44 containing silicon.

Figure 4A:
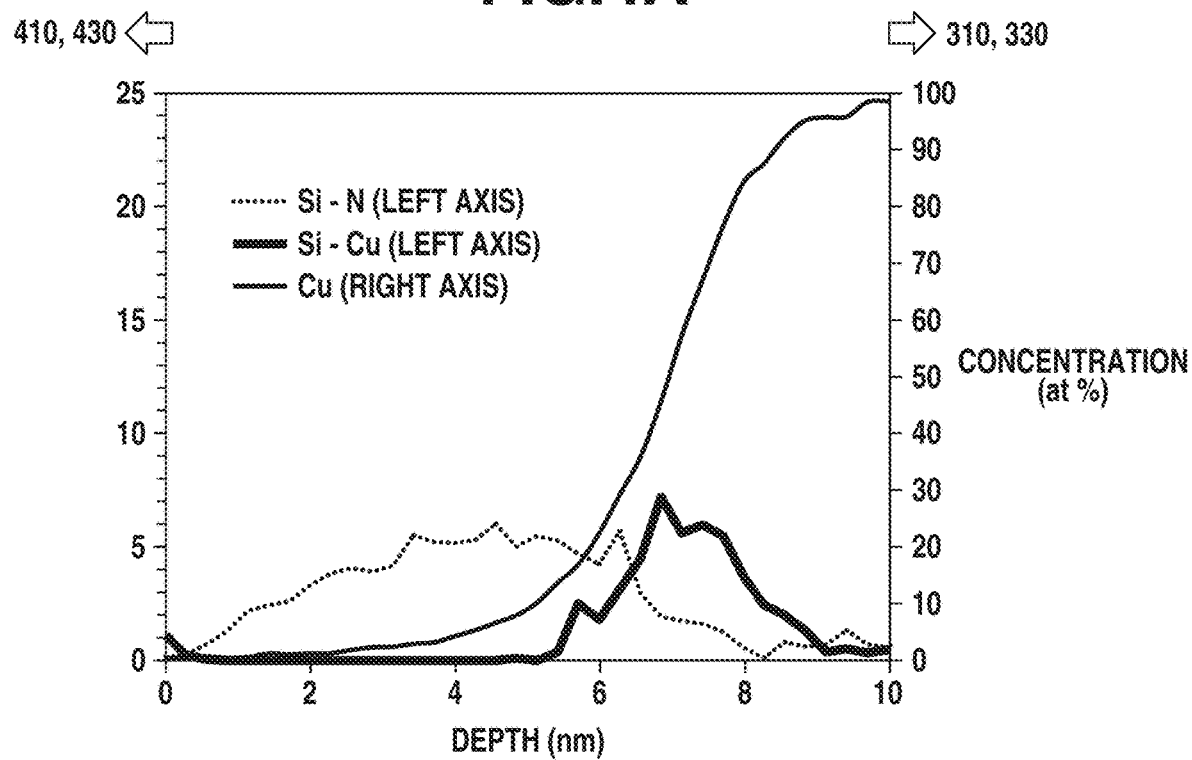
FIGS. 4A and 4B are charts for describing a chemical state of intermediate regions.
Figure 4B:
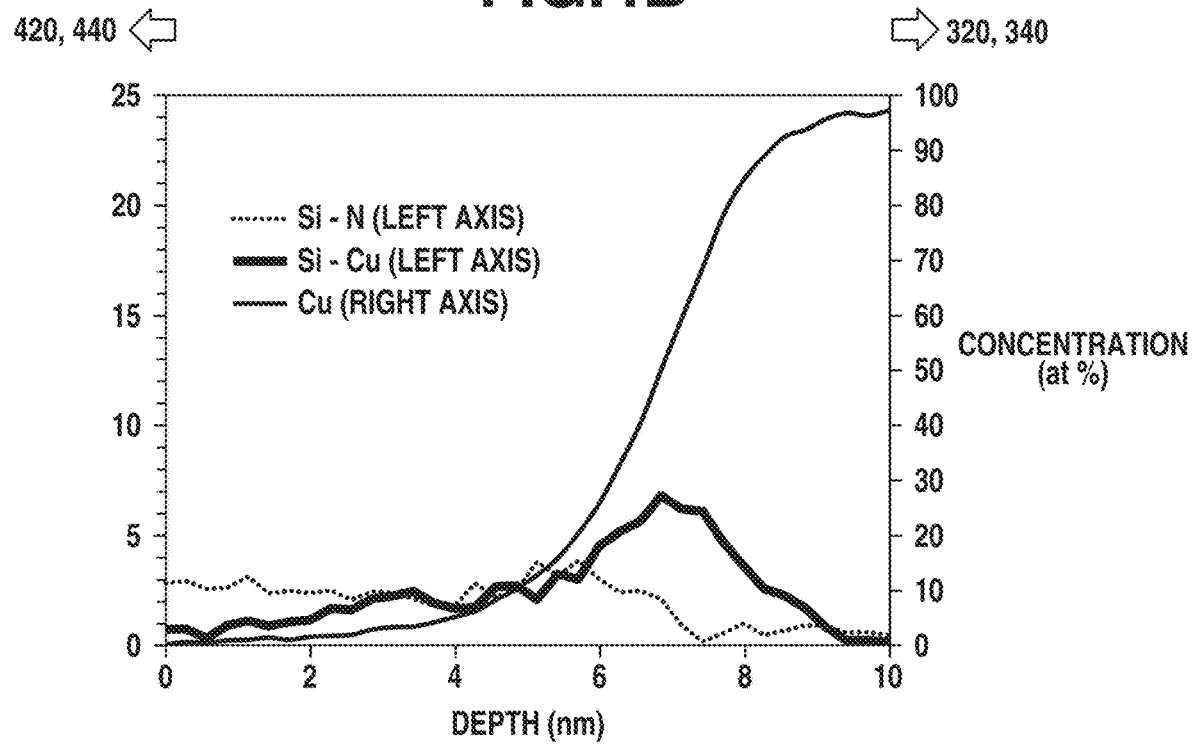

FIGS. 4A and 4B illustrate examples of analyses of a bonding state (chemical state) using XPS near an interface between a conductor layer and an insulator layer. For the analysis, conductor layers made of copper and insulator layers made of SiC were used. FIG. 4A illustrates a bonding profile of the intermediate regions 51 and 53 in a case where silicon and nitrogen were doped as described above. FIG. 4B illustrates a bonding profile of the intermediate regions 52 and 54 in a case where neither silicon nor nitrogen was doped as described above. The XPS measurements of the bonding states of the interfaces show that the intensity (in arbitrary units) of the Si—N bond near the interfaces (intermediate regions 52 and 54) between the conductor layers 32, 34 and the insulator layers 42, 44 where the nitrogen concentration is low is around 3. By contrast, the intensity of the Si—N bond near the interfaces (intermediate regions 51 and 53) between the conductor layers 31, 32 and the insulator layers 41, 43 where the nitrogen concentration is high is 4 to 8. If, for example, the insulator layers 41 and 43 are made of SiC, the presence of the Si—N bond enables formation of a favorable Cu—SiN bond and an SiN—SiC bond, whereby conductor layers and insulator layers with high adhesion can be formed. There are bonds with Si, namely, an Si—N bond and an Si—Cu bond at the interfaces between the insulator layers and the conductor layers. For the sake of comparison in terms of positions in the depth direction, FIGS. 4A and 4B also illustrate the Cu concentrations illustrated in FIGS. 2A and 2B. As illustrated in FIG. 4B, the intermediate regions 52 and 54 showed a peak of the Si—Cu bond but no clear peak of the Si—N bond. The Si—N bond was detected only within the range of measurement errors. By contrast, as illustrated in FIG. 4A, a clear peak of the Si—N bond was observed in the intermediate regions 51 and 53, as another bond peak separate from the Si—Cu bonding. This clearly shows that there is an Si—N bond in the range of 1 to 10 nm near the interfaces between the insulator layers (SiC) and the conductor layers (Cu).

Now, a first example will be described. The first exemplary embodiment is an example corresponding to the configuration 1.

Figure 5:
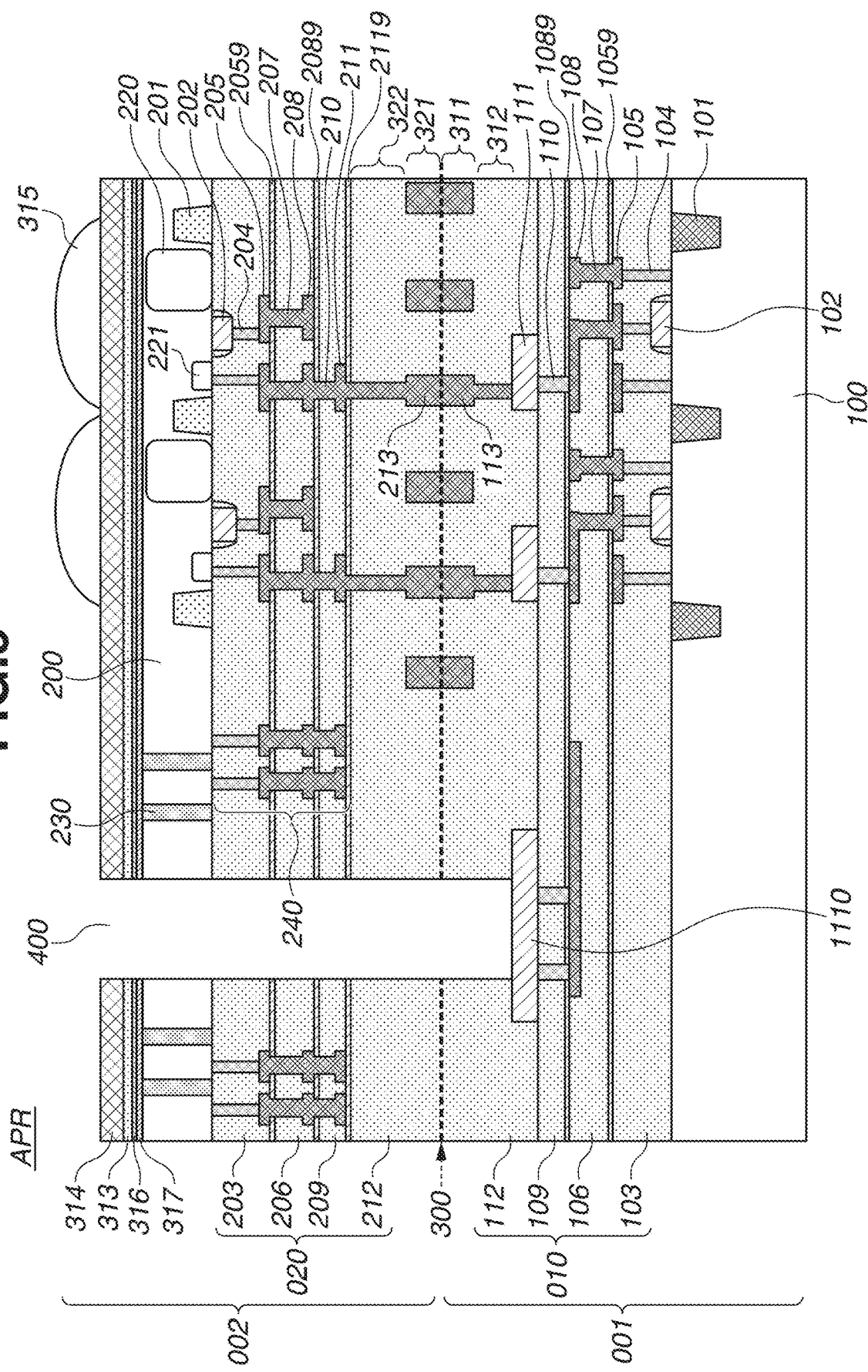
FIG. 5 is a schematic sectional view for describing a semiconductor apparatus according to a first example.

FIG. 5 is a schematic sectional view of a semiconductor apparatus APR according to the first example. The semiconductor apparatus APR includes a semiconductor layer 100 and a semiconductor substrate 200 stacked on each other. The semiconductor apparatus APR includes a wiring structure 010 between the semiconductor layer 100 and the semiconductor substrate 200, and a wiring structure 020 disposed between the wiring structure 010 and the semiconductor substrate 200. In the semiconductor apparatus APR, the wiring structures 010 and 020 are bonded to each other. The wiring structures 010 and 020 are bonded at a bonding surface 300 between a bonding region 311 of the wiring structure 010 and a bonding region 321 of the wiring structure 020. The bonding surface 300 includes the surface of the bonding region 311 and the surface of the bonding region 321.

The wiring structure 010 includes an interlayer insulation layer 103, contact plugs 104, a conductor layer 105, an insulator layer 1059, an interlayer insulation layer 106, via plugs 107, a conductor layer 108, an insulator layer 1089, an interlayer insulation layer 109, via plugs 110, and a conductor layer 111. The wiring structure 020 includes an interlayer insulation layer 203, contact plugs 204, a conductor layer 205, an insulator layer 2059, an interlayer insulation layer 206, via plugs 207, a conductor layer 208, an insulator layer 2089, an interlayer insulation layer 209, via plugs 210, and a conductor layer 211. The via plugs 107 and 207 connect the conductor layers 105 and 205 to the conductor layers 108 and 208, respectively. The via plugs 110 and 210 connect the conductor layers 108 and 208 to the conductor layers 111 and 211, respectively. The semiconductor apparatus APR also includes a guard ring 240 formed in the process of forming the contact plugs 204, the conductor layer 205, the via plugs 207, the conductor layer 208, the via plugs 210, and the conductor layer 211. The guard ring 240 is configured to surround an opening 400.

The wiring structures 010 and 020 respectively include insulator films 112 and 212 over the conductor layers 111 and 211, and conductor portions 113 and 213. The conductor portions 113 and 213 have a damascene structure, being embedded in recesses formed in the insulator films 112 and 212. At least some of the conductor portions 113 and 213 are connected to the conductor layers 111 and 211 of the wiring structures 010 and 020. In particular, the conductor layer 111 includes an electrode 1110 which is to be externally connected. In the present example, the conductor portions 113 and 213 have a dual damascene structure. Regions of the conductor portions 113 and 213 corresponding to trenches of the dual damascene structure are included in the bonding regions 311 and 321. Regions of the conductor portions 113 and 213 that correspond to vias of the dual damascene structure are included in connection regions 312 and 322 connecting to the conductor layers 111 and 211.

The conductive portions 113 and 213 can be mainly made of copper. However, this is not restrictive, and the conductor portions 113 and 213 may be mainly made of gold or silver. The insulator films 112 and 212 can be mainly made of a silicon compound. There are concerns about metal diffusion due to bonding deviations of the conductor portions 113 and 213 caused by misalignment that occurs during wafer bonding. As a countermeasure, the insulator films 112 and 212 may have a multilayer film structure where a layer for preventing metal diffusion (for example, silicon nitride layer) and a silicon oxide layer are stacked to prevent the effect of metal diffusion. However, this is not restrictive, and the insulator films 112 and 212 may be mainly made of resin.

Element regions (active regions) of the semiconductor layer 100 and the semiconductor substrate 200 are defined by element isolations 101 and 201 having a shallow trench isolation (STI) structure.

The semiconductor layer 100 includes a plurality of transistors 102. The plurality of transistors 102 in the semiconductor layer 100 can constitute a complementary metal-oxide-semiconductor (CMOS) circuit. If the semiconductor apparatus APR serves as a photoelectric conversion apparatus, an integrated circuit in the semiconductor layer 100 can include a signal processing circuit for processing pixel signals, such as an analog-to-digital (AD) conversion circuit and a noise reduction circuit.

The semiconductor substrate 200 includes photodiodes 220 and floating diffusions 221. Gate electrodes 202 on the semiconductor substrate 200 transfer charges in the photodiodes 220 to the floating diffusions 221. The semiconductor substrate 200 further includes pixel circuits PXC for converting the charges generated by the photodiodes 220 into pixel signals. The pixel circuits PXC include pixel transistors such as a reset transistor, an amplification transistor, and a selection transistor.

The semiconductor apparatus APR serving as a photoelectric conversion apparatus includes a metal oxide film 317, an antireflection film 316, an insulation film 313, a color filter 314, and microlenses 315 located on the semiconductor substrate 200. The insulation film 313 can include a light shielding film for forming an optical black (OB) region, and light shielding walls for separating light of respective pixels to prevent mixing of colors. The light shielding film can be made of a metal film such as a tungsten film.

Copper is mainly used for the conductor layers and as a conductive material. In the wiring structure 010, the interface between the conductor layer 108 and the insulator layer 1089 has a nitrogen concentration which is higher than that of the interface between the conductor layer 105 and the insulator layer 1059. Interfaces between conductor layers and insulator layers farther from the semiconductor layer 100 have a higher nitrogen concentration than that of interfaces between conductor layers and insulators that are closer. If an interface between a conductor layer and an insulator layer has a high nitrogen concentration, the adhesion of the conductor layer and the insulator layer improves, but wiring resistance can increase and a hillock can occur on the surface of the wiring. An interface having a high nitrogen concentration is therefore not desirable for the conductor layer 105 that is close to the semiconductor layer 100 where fine wiring is desired. Such an interface should be used for the conductor layer 108 where the necessity for fine wiring is not so great. Similarly, in the wiring structure 020, the interface between the conductor layer 211 and the insulator layer 2119 has a nitrogen concentration which is higher than that of the interface between the conductor layer 205 and the insulator layer 2059. Interfaces between conductor layers and insulator layers disposed farther from the semiconductor substrate 200 desirably have a higher nitrogen concentration than that of interfaces between conductor layers and insulator layers that are closer to the semiconductor substrate 200. Interfaces between conductor layers and insulator layers disposed farther from the semiconductor substrate 200 and closer to the bonding surface 300 desirably have a higher nitrogen concentration. An example of such interfaces is the one that contain a lot of Si—N bonds. Thus, a semiconductor apparatus can be constructed that can withstand mechanical load in a thinning process, whereby the reliability of the semiconductor apparatus can be improved.

A method for manufacturing the semiconductor apparatus APR illustrated in FIG. 5 will be described with reference to FIGS. 6A to 8B.

Figure 6A:
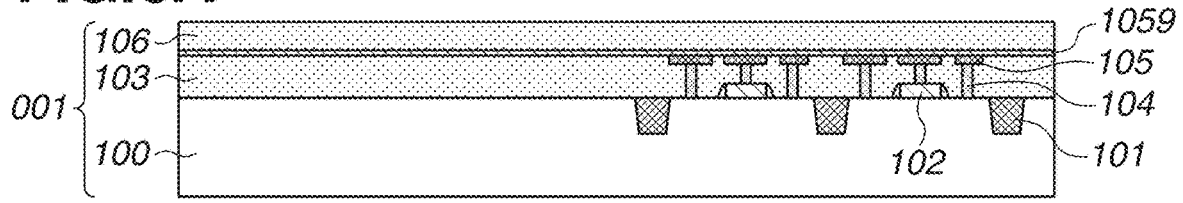
FIGS. 6A to 6E are schematic sectional views for describing a method for manufacturing the semiconductor apparatus according to the first example.

As illustrated in FIG. 6A, a first part 001 is prepared. The first part 001 includes the semiconductor layer 100, the element isolations 101, the gate electrodes 102, the interlayer insulation layer 103, and the contact plugs 104. The first part 001 further includes the conductor layer 105, the insulator layer 1059, and the interlayer insulation layer 106. The doping of nitrogen as described with reference to FIG. 3 is not performed between the formation of the conductor layer 105 and the formation of the insulator layer 1059.

Figure 6B:
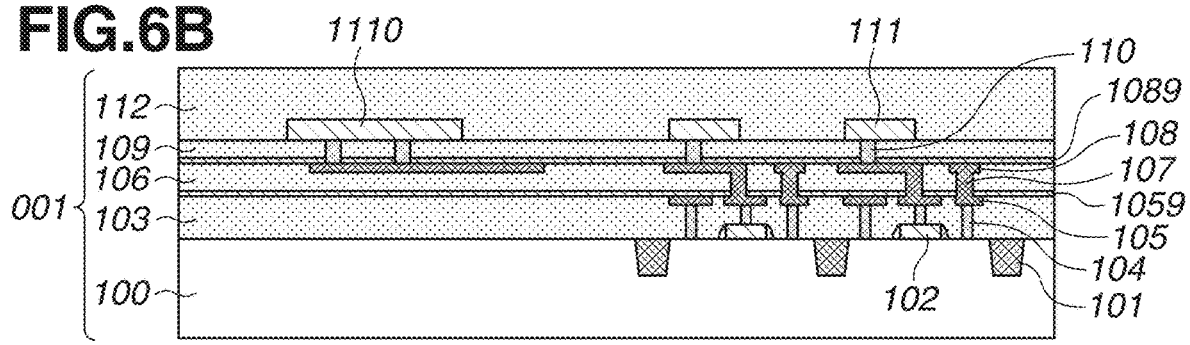

Next, as illustrated in FIG. 6B, the conductor layer 108 including the via plugs 107 is formed in the interlayer insulation layer 106 through dual damascening. Nitrogen is doped into the conductor layer 108 as described with reference to FIGS. 3A to 3E. The insulator layer 1089 and the interlayer insulation layer 109 are formed over the nitrogen-doped conductor layer 108. The insulator layer 1089 is, for example, a silicon carbide layer. The interlayer insulation layer 109 is, for example, a silicon oxide film, a silicon nitride film, a silicon oxynitride film, a carbon-containing silicon oxide film, and a fluorine-containing silicon oxide film. The interlayer insulation layer 109 may have a single layer configuration including one type of material, or a multilayer configuration including a plurality of materials. Next, trenches are formed in the surface of the interlayer insulation layer 109 through etching. A conductor is formed over the entire substrate surface through PVD or CVD so that the trenches are filled with the conductor. The conductor on the substrate surface is removed through CMP or etch-back, whereby the via plugs 110 are formed in the interlayer insulation layer 109.

Next, a conductor film is formed. The conductor film can be made of aluminum. Next, the conductor film is patterned. The patterning is performed through photolithography and etching, whereby the conductor layer 111 is formed. Part of the conductive film is patterned into the electrode 1110. In the example of FIG. 6B, three conductor layers are formed, whereas the number of conductor layers can be freely selected. In the example of FIG. 6B, only MOS transistors are arranged on the surface of the semiconductor layer 100. However, the present exemplary embodiment is not limited thereto. For example, MOS capacitors, trench capacitors, resistors using part of the semiconductor layer 100, and resistors using polysilicon can also be arranged. Metal-insulator-metal (MIM) capacitors may be arranged between the conductor layers.

Next, the insulator film 112 is formed as illustrated in FIG. 6B. The insulator film 112 is, for example, a silicon oxide film, a silicon nitride film, a silicon oxynitride film, a carbon-containing silicon oxide film, and a fluorine-containing silicon oxide film. For example, disadvantages arising from differences in height in subsequent processes can be reduced by forming a silicon oxide film and then flattening the silicon oxide film through CMP. The insulator film 112 may have a single layer configuration including one type of material. However, there are concerns about metal diffusion in the conductor portion 213 due to bonding deviations between the conductor portions 213 and 113 caused by misalignment occurring during wafer bonding. The insulator film 112 may, therefore, have a multilayer structure including a plurality of materials, like a film structure where a layer for preventing metal diffusion (for example, a silicon nitride layer) and a silicon oxide layer are stacked to prevent the effect of metal diffusion.

Figure 6C:
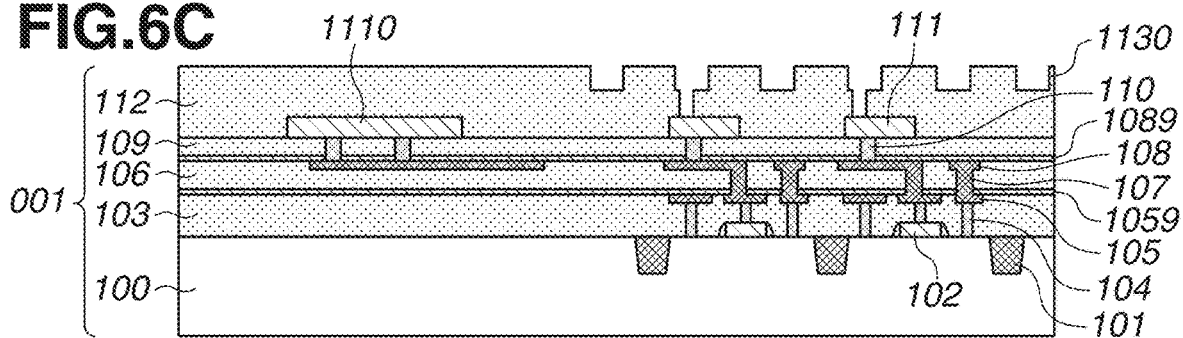

Next, as illustrated in FIG. 6C, a plurality of recesses 1130 for embedding conductor portions in the insulator film 112 is formed. At least some of the recesses 1130 are formed to have via holes reaching the conductor layer 111. The recesses 1130 are laid out over the entire chip with appropriate density. The recesses 1130 include trenches and via holes disposed at the bottoms of some of the trenches. The trenches are formed in the bonding regions 311, and the via holes in the connection regions 312.

Figure 6D:
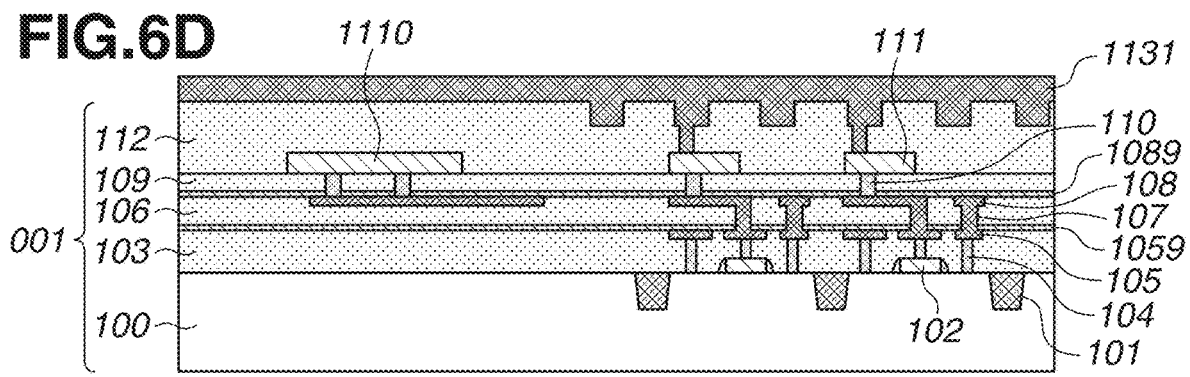

Next, as illustrated in FIG. 6D, a conductor material 1131 is formed over the entire substrate surface. In this process, the recesses 1130 are filled with the conductor material 1131. Copper can be used as the material of the conductor material 1131.

Figure 6E:
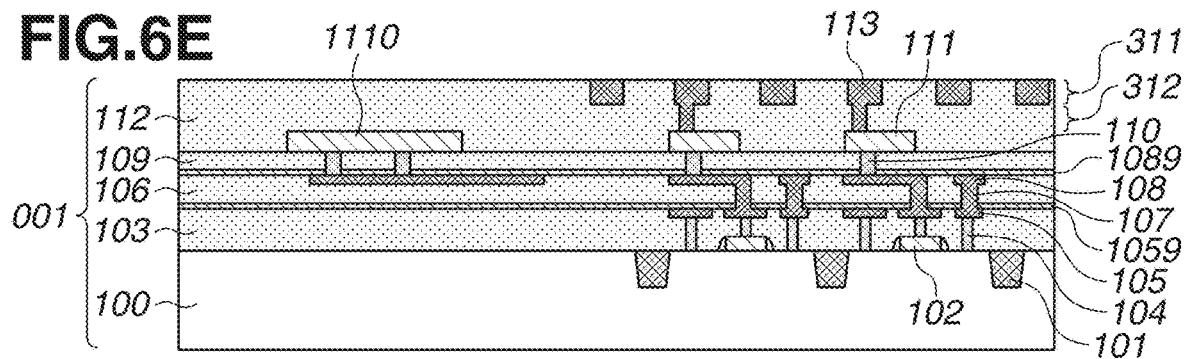

Next, as illustrated in FIG. 6E, the excess of the conductor material 1131 is removed through CMP, whereby the conductor portions 113 are formed. Thus, the part 001 before undergoing the bonding is completed. Since the conductor portions 113 are formed over the entire chip with appropriate density during CMP, dishing and erosion due to CMP are reduced. This improves the flatness of the substrate surface of the part 001 before the bonding. Disadvantages arising from differences in height during the wafer bonding can thus be reduced.

Figure 7A:
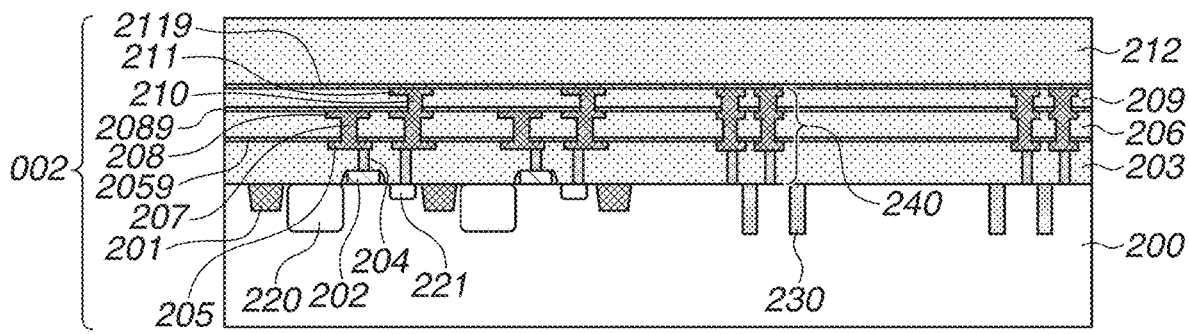
FIGS. 7A to 7D are schematic sectional views for describing the method for manufacturing the semiconductor apparatus according to the first example.

As illustrated in FIG. 7A, a second part 002 is prepared. The second part 002 includes the semiconductor substrate 200, the device isolations 201, the gate electrodes 202, the interlayer insulation layer 203, and the contact plugs 204. The semiconductor substrate 200 is provided with the photodiodes 220 and the floating diffusions 221. Isolation regions 230 are also formed in the semiconductor substrate 200. The isolation regions 230 desirably has such a depth that the isolation regions 230 are exposed when the semiconductor substrate 200 is thinned during the wafer bonding. The isolation regions 230 are formed by embedding an insulation film such as an SiN film. The second part 002 further includes the conductor layer 205, the insulator layer 2059, the interlayer insulation layer 206, the conductor layer 208, and the via plugs 207 connecting the conductor layer 205 to the conductor layer 208. The second part 002 further includes the interlayer insulation layer 209, the conductor layer 211, the insulator layer 2089, the insulator layer 2119, and the via plugs 210 connecting the conductor layer 208 to the conductor layer 211. The second part 002 further includes the guard ring 240 formed in the process of forming the contact plugs 204, the conductor layer 205, the via plugs 207, the conductor layer 208, the via plugs 210, and the conductor layer 211. In FIG. 7A, the number of conductor layers is three, whereas the number of conductor layers can be freely selected.

With respect to the maximum nitrogen concentrations of the interfaces between the respective conductor layers and insulator, the interface between the conductor layer 211 and the insulator layer 2119 far from the semiconductor substrate 200 has a maximum nitrogen concentration which is higher than the interface between the conductor layer 205 and the insulator layer 2059 close to the semiconductor substrate 200. The doping of nitrogen described with reference to FIGS. 3A to 3E is not performed between the formation of the conductor layer 205 and the formation of the insulator layer 2059. The doping of nitrogen described with reference to FIGS. 3A to 3E is not performed between the formation of the conductor layer 208 and the formation of the insulator layer 2089. The doping of nitrogen described with reference to FIGS. 3A to 3E is performed between the formation of the conductor layer 211 and the formation of the insulator layer 2119. Since the method for increasing the maximum nitrogen concentration by doping nitrogen has been described with reference to FIGS. 3A to 3E, a description thereof will be omitted here.

In the present example, only MOS transistors are arranged on the surface of the semiconductor substrate 200. However, this is not restrictive. For example, MOS capacitors, trench capacitors, resistors using part of the semiconductor substrate 200, and resistors using the gate electrodes 202 may also be arranged. MIM capacitors may also be arranged between the conductor layers.

Next, the insulator film 212 is formed. Examples of the insulator film 212 is a silicon oxide film, a silicon nitride film, a silicon oxynitride film, a carbon-containing silicon oxide film, and a fluorine-containing silicon oxide film. The insulator film 212 may have a single layer configuration including one type of material. However, there are concerns about metal diffusion due to bonding deviations between the conductor portions 113 and 213 caused by misalignment occurring during wafer bonding. The insulator film 112 may therefore have a multilayer structure including a plurality of materials, such as a film structure where a layer for preventing metal diffusion (for example, an SiN layer) and a silicon oxide layer are stacked to prevent the effect of metal diffusion.

Figure 7B:
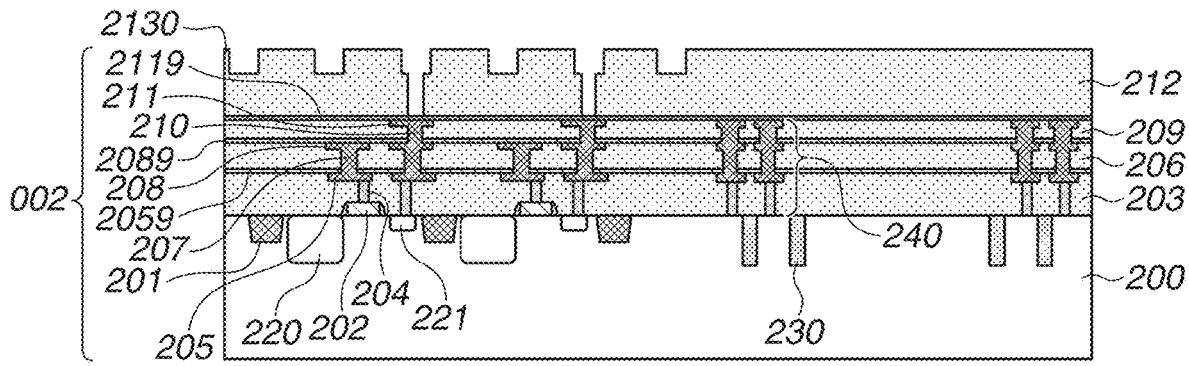

Next, as illustrated in FIG. 7B, a plurality of recesses 2130 for embedding conductor portions in the insulator film 212 is formed. The recesses 2130 include trenches and via holes formed in the bottoms of some trenches. At least some of the recesses 2130 are formed to have via holes reaching the conductor layer 211. The trenches are formed in the bonding regions 321, and the via holes in the connection regions 322. The recesses 2130 are laid out over the entire chip with appropriate density.

Figure 7C:
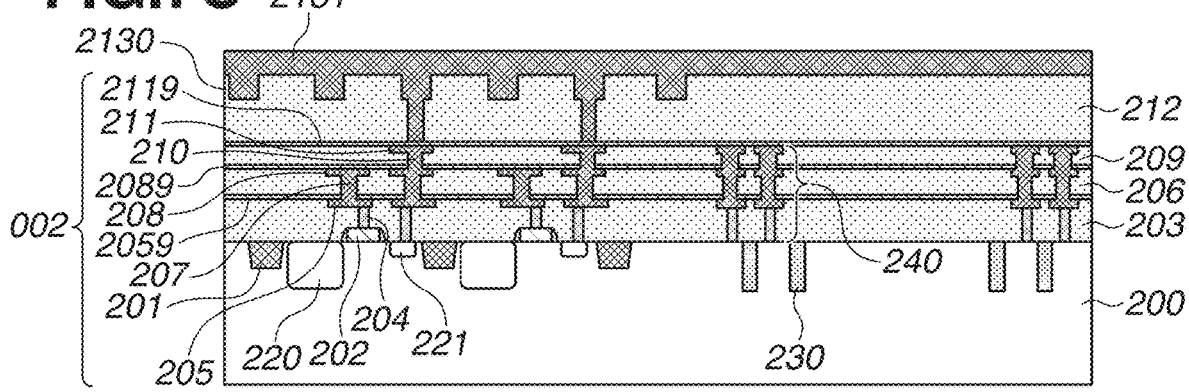

Next, as illustrated in FIG. 7C, a conductor material 2131 is formed over the entire substrate surface. Here, the recesses 2130 are filled with the conductor material 2131. Copper can be used as the material of the conductor material 2131.

Figure 7D:
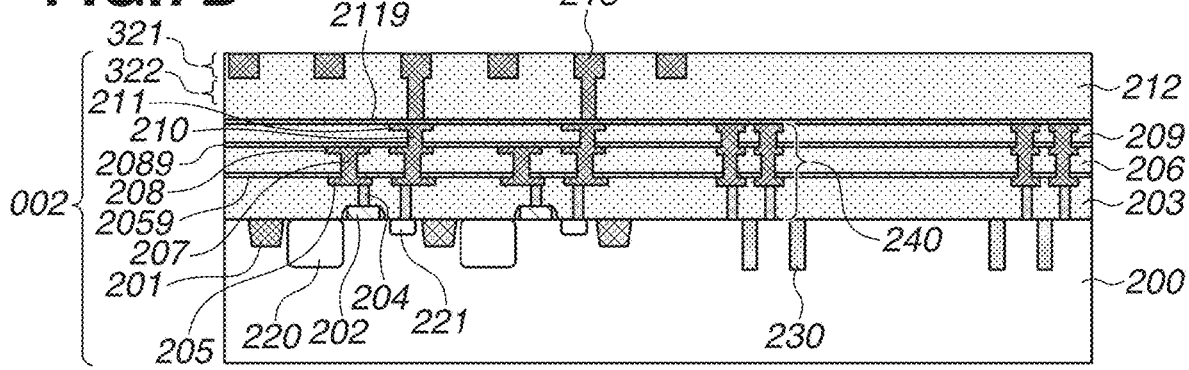

Next, as illustrated in FIG. 7D, the excess of the conductor material 2131 is removed through CMP, whereby the conductor portions 213 connected to the conductor layer 211 are formed. Thus, the second part 002 before performing the bonding is completed. Since the recesses 2130 are laid out over the entire chip with appropriate density during CMP, dishing and erosion due to CMP are reduced. Thus, the flatness of the substrate surface of the second part 002 before the bonding is improved.

Next, as illustrated in FIG. 8A, the second part 002 is reversed, and the first and second parts 001 and 002 are bonded at the bonding surface 300. In the structure after the bonding, the second part 002 is stacked on the first part 001. In the structure, bonding failures can be reduced since the surfaces of the first and second parts 001 and 002 are flat. For example, the wafers (first and second parts 001 and 002) are temporarily bonded through plasma-activated bonding. Heat treatment is then performed at, e.g., 350° C., whereby the insulator film 112 is bonded to the insulator film 212 at the bonding surface 300, and the conductor portions 113 to the conductor portions 213.

Next, as illustrated in FIG. 8B, the semiconductor substrate 200 of the second part 002 is thinned to a thickness from around several micrometers to several tens of micrometers. As the thinning method, for example, backgrinding, CMP, and etching can be used. The semiconductor substrate 200 is desirably thinned until the isolation regions 230 are exposed. In the process, the first and second parts 001 and 002 undergo a high mechanical load. If exfoliation occurs in the bonding surface 300 or the portions of the wiring structures 010 and 020 where adhesion is low, the reliability drops. In the present exemplary embodiment, the adhesion is enhanced in the semiconductor layer 100, and the conductor layers 108 and 211 disposed far from the semiconductor substrate 200 or close to the bonding surface 300 where the adhesion tends to decrease. An exfoliation-free high-reliability semiconductor apparatus can thus be constructed. Next, the metal oxide film 317, the antireflection film 316, and the insulation film 313 are formed on the surface of the semiconductor substrate 200 of the second part 002. The metal oxide film 317 are a hafnium oxide film or an aluminum oxide film, for example. An example of the antireflection film 316 is a tantalum oxide film. The insulation film 313 can be arbitrarily selected from materials commonly used for semiconductor apparatuses. For example, a silicon oxide film, a silicon nitride film, a silicon oxynitride film, a carbon-containing silicon oxide film, or a fluorine-containing silicon oxide film can be selected. The insulation film 313 may have a single layer configuration including one type of material or a multilayer configuration including a plurality of materials. Although not illustrated in the diagrams, the insulation film 313 may include a light shielding film for forming an OB region, and light shielding walls for separating light of respective pixels to prevent mixing of colors. The light shielding film may be made of a metal film such as a tungsten film. Next, the color filter 314 and the microlenses 315 can be formed on the semiconductor substrate 200.

Next, as illustrated in FIG. 5, the opening 400 for exposing part of the electrode 1110 is formed by etching from the topmost surface of the stacked substrates. The etching for forming the opening 400 uses a photoresist mask. The etching can be performed through dry etching, for example. The presence of the isolation regions 230 outside the opening 400 can reduce the effect of charge build-up occurring in the dry etching on the elements in the semiconductor substrate 200. The presence of the guard ring 240 outside the isolation regions 230 can also reduce the possibility of destruction due to charge build-up. The semiconductor apparatus APR is then completed through subsequent assembly processes such as formation of a conductive member connected to the electrode 1110 in the opening 400 by dicing and wire bonding.

A second example will now be described. The second example is an example corresponding to the configuration 7.

Figure 9:
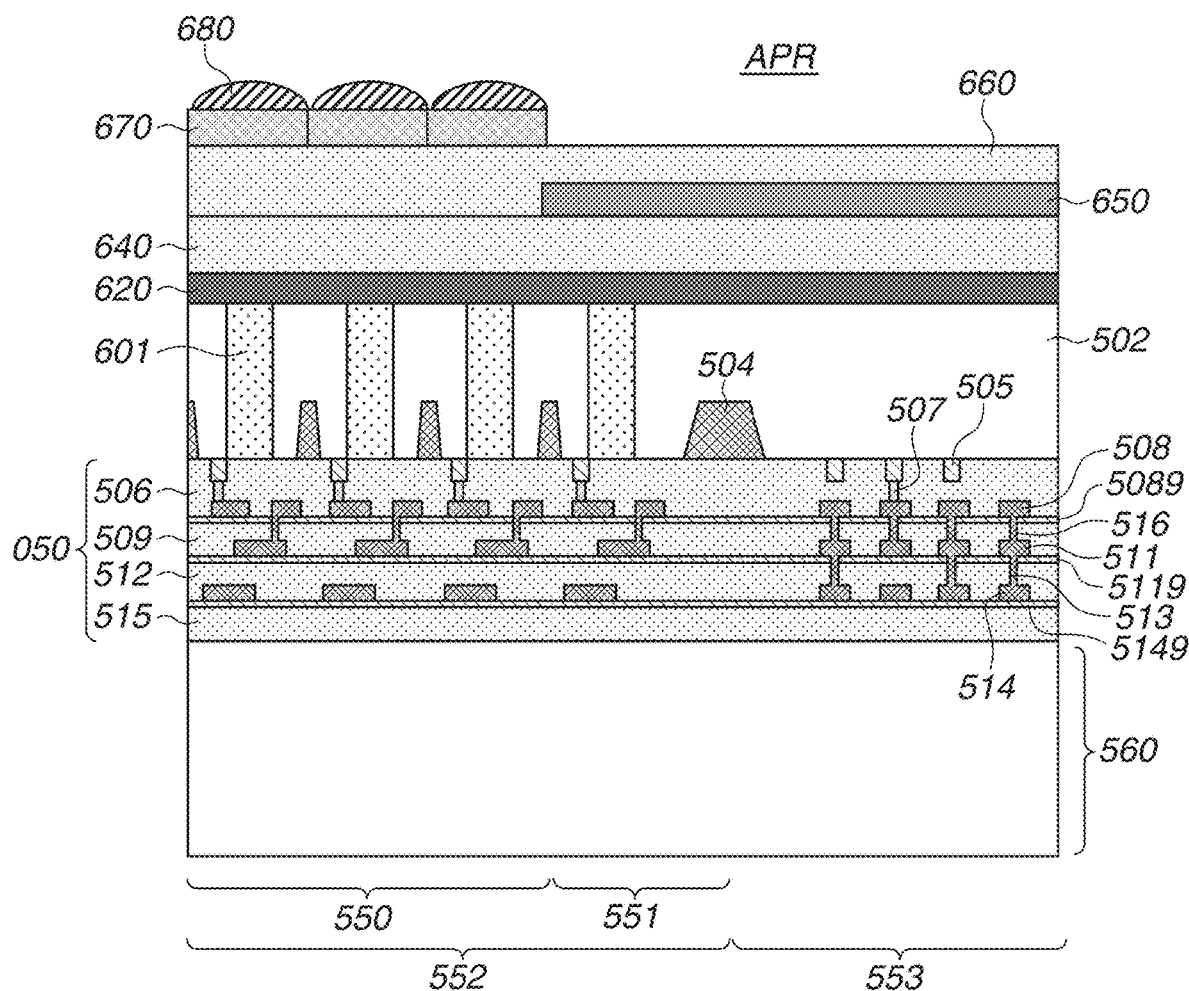
FIG. 9 is a schematic sectional view for describing a semiconductor apparatus according to a second example.

The second example will be described with reference to FIG. 9. As illustrated in FIG. 9, a semiconductor apparatus APR according to the second example is a back-illuminated photoelectric conversion apparatus. The semiconductor apparatus APR according to the second example includes a semiconductor substrate 502. The semiconductor substrate 502 has a backside where light is incident, and a surface opposite to the backside. The semiconductor substrate 502 includes photoelectric conversion units 601 that photoelectrically convert the incident light and accumulate signal charges, and transistors 505 disposed on the surface. A plurality of pixels is two-dimensionally arranged in a pixel region 552. Each pixel includes a photoelectric conversion unit 601 and pixel transistors. The pixel transistor is, for example, a transfer transistor, an amplification transistor, a reset transistor, and a selection transistor. The pixel transistor is some or all of such transistors. The pixel transistors may further include other conventional transistors. The pixel region 552 is divided into two regions: a light reception region 550 where light reception pixels for imaging are disposed and a light shielding region 551 where light shielding pixels for reading a dark current component signal are disposed. The semiconductor substrate 502 also includes a peripheral circuit region 553. The peripheral circuit region 553 includes a read circuit for reading from the pixel region 552 and a digital signal processing circuit. The semiconductor substrate 502 further includes a fixed charge film 620 on the backside. An insulation layer 640 is disposed on the fixed charge film 620, and a light shielding layer 650 is disposed on the insulation layer 640. The light shielding layer 650 is disposed over the light shielding region 551 and the peripheral circuit region 553, and not over the light reception region 552. An insulation layer 660 is disposed on the insulation layer 640 and the light shielding layer 650. The purpose of the insulation layer 640 is disposed to eliminate a difference in height caused by the light shielding layer 650. A color material layer 670 is disposed on the insulation layer 660, and microlenses 680 are further disposed thereon.

A wiring structure 050 is disposed on the surface side of the semiconductor substrate 502. The wiring structure 050 includes an interlayer insulation layer 506 and contact plugs 507. The wiring structure 050 further includes a conductor layer 508, an insulator layer 5089, an interlayer insulation layer 509, via plugs 516, a conductor layer 511, an insulator layer 5119, an interlayer insulation layer 512, via plugs 513, a conductor layer 514, an insulator layer 5149, and an insulation layer 515. The via plugs 516 connect the conductor layer 508 to the conductor layer 511. The via plugs 513 connect the conductor layer 511 to the conductor layer 514. The wiring structure 050 includes a support substrate 560 to improve the strength of the semiconductor apparatus APR. As the support substrate 560, for example, a silicon substrate can be used, and a glass substrate may also be used. The support substrate 560 and the insulation layer 515 of the wiring structure 050 can be bonded by plasma-activated bonding, for example.

In the wiring structure 050, the conductor layer 514 has a relatively large wiring width, which weakens the adhesion between the conductor layer 514 and the insulator layer 5149. The maximum nitrogen concentration near the interface between the conductor layer 514 and the insulator layer 5149 is higher than that near the interface between the conductor layer 508 and the insulator layer 5089. The method described with reference to FIGS. 3A to 3E can be used as a method for increasing the nitrogen concentration. Since the maximum nitrogen concentration near the interface between the conductor layer 514 and the insulator layer 5149 is high, the adhesion between the conductor layer 514 and the insulator layer 5149 is improved. The backside of the semiconductor substrate 502 is thinned to improve photoelectric conversion efficiency. However, and the wiring structure 050 is placed under a mechanical load in the CMP process. Exfoliation of the conductor layer 514 and the insulator layer 5149 in the process is prevented by increasing the maximum nitrogen concentration near the interface between the conductor layer 514 and the insulator layer 5149, whereby a highly-reliable semiconductor apparatus APR can be provided. As for the conductor layers 508 and 511 other than the conductor layer 514, the maximum nitrogen concentrations near the interfaces with the insulator layers 5089 and 5119 is lowered to suppress an increase in the connection resistances with the via plugs 516 and 513, and high-speed operation and low power consumption can be achieved.

A third example will now be described below. The third example corresponds to the configuration 9.

Figure 10:
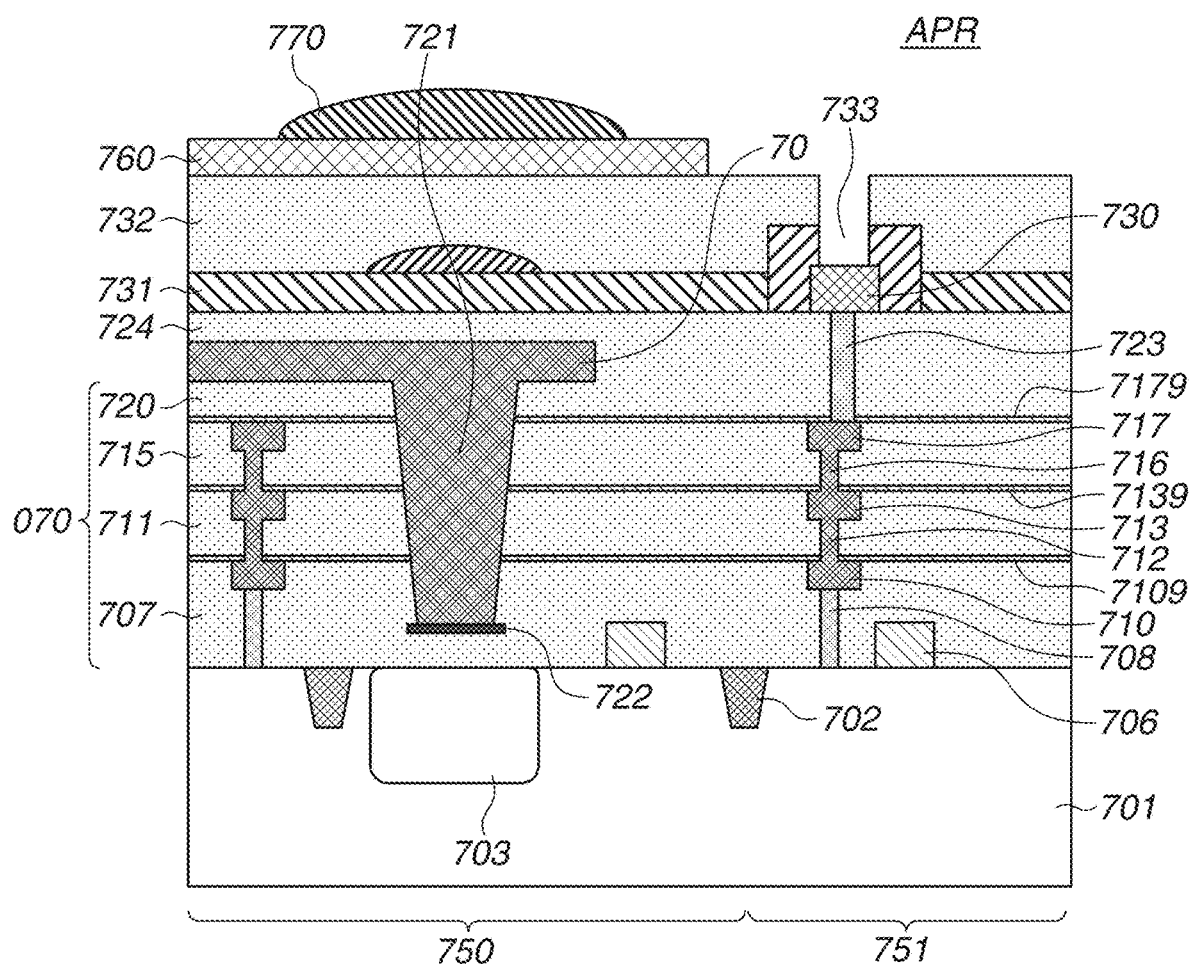
FIG. 10 is a schematic sectional view for describing a semiconductor apparatus according to a third example.

The third example will be described with reference to FIG. 10. As illustrated in FIG. 10, a semiconductor apparatus APR according to the third example includes a semiconductor substrate 701. Element isolations 702 having an STI structure define element regions (active regions) of the semiconductor substrate 701. The semiconductor apparatus APR includes transistors 706 on the semiconductor substrate 701. The semiconductor substrate 701 includes a pixel region 750 and a peripheral circuit region 751. A plurality of pixels is two-dimensionally arranged in the pixel region 750. In the pixel region 750, the semiconductor substrate 701 also includes a photoelectric conversion unit 703 that photoelectrically converts incident light and accumulates a charge. Each pixel includes pixel transistors. The pixel transistor is, for example, a transfer transistor, an amplification transistor, a reset transistor, and a selection transistor. The peripheral circuit region 751 includes a read circuit for reading from the pixel region 750 and a digital signal processing circuit. In the peripheral circuit region 751, sources and drains of the transistors 706 on the semiconductor substrate 701 can include a silicide layer such as a cobalt silicide layer and a nickel silicide layer. The gate electrodes of the transistors 706 on the semiconductor substrate 701 can include a silicide layer, a metal layer, or a metal compound layer. The gate insulation films of the transistors 706 on the semiconductor substrate 701 can be a silicon nitride film or a metal oxide film.

A wiring structure 070 is disposed on the semiconductor substrate 701. The wiring structure 070 includes an interlayer insulation layer 707 and contact plugs 708. The wiring structure 070 further includes a conductor layer 710, an insulator layer 7109, an interlayer insulation layer 711, via plugs 712, a conductor layer 713, an insulator layer 7139, an interlayer insulation layer 715, via plugs 716, a conductor layer 717, an insulator layer 7179, and an interlayer insulation layer 720. The via plugs 712 connect the conductor layer 710 to the conductor layer 713. The via plugs 716 connect the conductor layer 713 to the conductor layer 717. A dielectric member 70 made of silicon nitride is disposed over the semiconductor substrate 701. The dielectric member 70 includes a light guide portion 721. The light guide portion 721 is intended to increase the light efficiency of light incident on the photoelectric conversion unit 703, and can be disposed over the photoelectric conversion unit 703. The light guide portion 721 is surrounded by the interlayer insulation layer 707, the insulator layer 7109, the interlayer insulation layer 711, the insulator layer 7139, the interlayer insulation layer 715, the insulator layer 7179, and the interlayer insulation layer 720. An etch stop layer 722 used in forming a hole intended for the light guide portion 721 is disposed between the light guide portion 721 and the photoelectric conversion unit 703. To increase the light efficiency, the top surface of the light guide portion 721 is disposed above the conductor layer 717. The light guide portion 721 may be the convex in the uneven bottom surface of the dielectric member 70. The material within the light guide portion 721 should have a refractive index which is higher than that of the interlayer insulation layers 707 to 720 so that the light incident on the light guide portion 721 is reflected inside the light guide portion 721. An interlayer insulation layer 724, a conductor layer 730, and a via plug 723 are disposed above the light guide portion 721. The via plug 723 runs through the interlayer insulation layers 724 and 720 and connects the conductor layer 730 to the conductor layer 717. An intralayer lens 731 is disposed over the light guide portion 721. The intralayer lens 731 may include a plurality of insulation layers. An interlayer insulation layer 732 is disposed over the intralayer lens 731. The interlayer insulation layer 732 and the intralayer lens 731 on part of the conductor layer 730 have an opening. A color filter 760 is disposed on the interlayer insulation layer 732, and a microlens 770 is further disposed thereon.

In the wiring structure 070, the conductor layer 717 has a large wiring width, which weakens the adhesion between the conductor layer 717 and the insulator layer 7179. The interface between the conductor layer 717 and the insulator layer 7179 has a nitrogen concentration which is higher than that of the interface between the conductor layer 710 and the insulator layer 7109. The method for increasing the nitrogen concentration is the same as described with reference to FIGS. 3A to 3E, and a description thereof will be omitted here. The maximum nitrogen concentration near the interface between the conductor layer 717 and the insulator layer 7179 is high and there is an Si—N bond, so that the adhesion between the conductor layer 717 and the insulator layer 7179 is improved. In forming the light guide portion 721, dielectric material is filled into the hole intended for the light guide portion 721 and the excess of the dielectric material needs to be removed by CMP. In the process, the wiring structure 050 is placed under a mechanical load, and exfoliation can occur at a place where the adhesion is weak. In particular, the exfoliation might occur between the conductor layer 717 and the insulator layer 7179 close to the top surface of the dielectric member 70 where the highest mechanical load acts during the CMP polishing. However, since the maximum nitrogen concentration near the interface between the conductor layer 717 and the insulator layer 7179 is increased to improve the adhesion, a conductor layer 717 can be provided that can withstand the mechanical load from the CMP during the formation of the light guide portion 721. As a result, a highly-reliable semiconductor apparatus APR can be provided.

Figure 12:
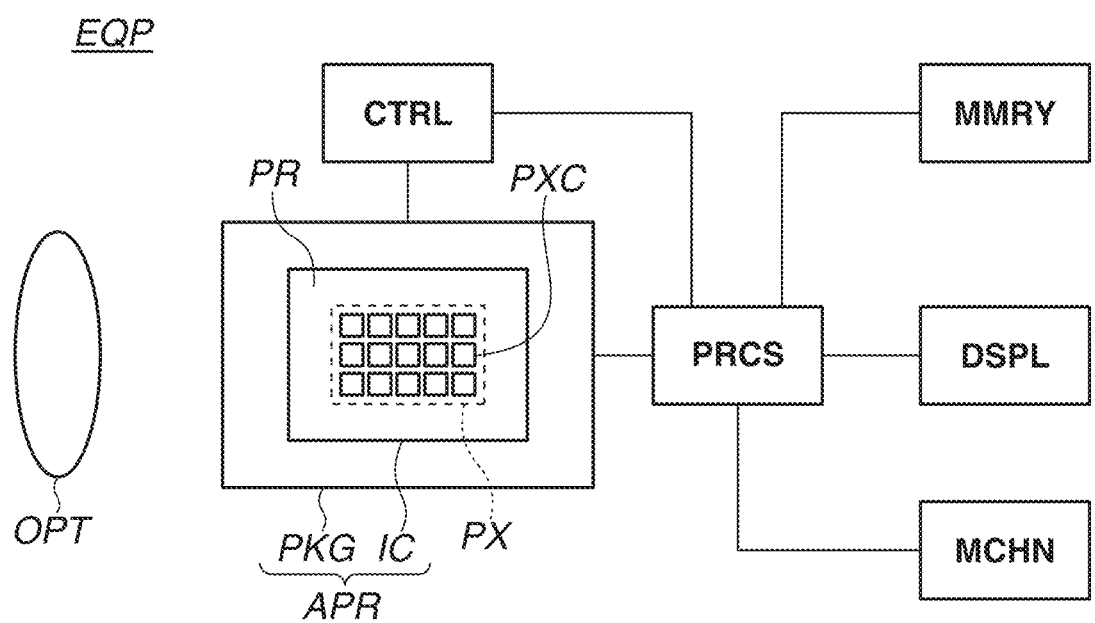
FIG. 12 is a schematic diagram for describing relevant equipment.

FIG. 12 is a schematic diagram for describing equipment EQP including a semiconductor apparatus APR. The semiconductor apparatus APR includes a semiconductor device IC including a semiconductor layer 10, and can further include a package PKG for mounting the semiconductor device IC. The semiconductor apparatus APR according to the present example is a photoelectric conversion apparatus. The semiconductor device IC includes a pixel region PX where pixel circuits PXC are arranged in a matrix, and a peripheral region PR around the pixel region PX. Peripheral circuits can be disposed in the peripheral region PR.

The equipment EQP can further include at least any one of the following: an optical apparatus OPT, a control apparatus CTRL, a processing apparatus PRCS, a display apparatus DSPL, a storage apparatus MMRY, and a mechanical apparatus MCHN.

The optical apparatus OPT corresponds to the semiconductor apparatus APR. The optical apparatus OPT is, for example, a lens, a shutter, and a mirror. The control apparatus CTRL controls the semiconductor apparatus APR. An example of the control apparatus CTRL is a semiconductor apparatus such as an application specific integrated circuit (ASIC).

The processing apparatus PRCS processes a signal output from the semiconductor apparatus APR. The processing apparatus PRCS is a semiconductor apparatus constituting an analog front end (AFE) or a digital front end (DFE) such as a central processing unit (CPU) and an ASIC. The display apparatus DSPL is an electroluminescence (EL) display apparatus or a liquid crystal display apparatus that displays information (image) obtained by the semiconductor apparatus APR. The storage apparatus MMRY is a magnetic device or a semiconductor device that stores the information (image) obtained by the semiconductor apparatus APR. The storage apparatus MMRY is volatile memories such as a static random access memory (SRAM) and a dynamic random access memory (DRAM), or nonvolatile memories such as a flash memory and a hard disk drive.

The mechanical apparatus MCHN includes a movable unit or propelling unit such as a motor and an engine. The equipment EQP displays the signal output from the semiconductor apparatus APR on the display apparatus DSPL or transmits the signal to the outside via a communication apparatus (not illustrated) included in the equipment EQP. For that purpose, it is desirable that the equipment EQP further includes the storage apparatus MMRY and the processing apparatus PRCS aside from a storage circuit and an arithmetic circuit included in the semiconductor apparatus APR. The mechanical apparatus MCHN may be controlled based on a signal output from the semiconductor apparatus APR.

The equipment EQP is suitable for electronic equipment such as an information terminal having an image capturing function (for example, a smartphone or a wearable terminal) and a camera (for example, a lens-interchangeable camera, compact camera, video camera, or surveillance camera). The mechanical apparatus MCHN in a camera can drive components of the optical apparatus OPT to carry out zooming, focusing, and shutter operations. Further, the mechanical apparatus MCHN in a camera can move the semiconductor apparatus APR to carry out anti-vibration operations.

The equipment EQP can be transportation equipment such as a vehicle, a ship, and an aircraft. The mechanical apparatus MCHN in transportation equipment can be used as a transportation apparatus. The equipment EQP serving as the transportation equipment is suitable for transporting the semiconductor apparatus APR or to assist and/or automate driving (manipulation) using an image capturing function. A processing apparatus PRCS for assisting and/or automating driving (manipulation) can perform processing for operating the mechanical apparatus MCHN serving as a transportation apparatus based on information obtained by the semiconductor apparatus APR. The equipment EQP may be medical equipment such as an endoscope, measurement equipment such as a distance measurement sensor, analytical equipment such as an electronic microscope, or office equipment such as a copying machine.

According to the present exemplary embodiment, exfoliation between insulator layers and conductor layers which include intermediate regions showings a relative high nitrogen concentration can be reduced. Between insulator layers and conductor layers which include intermediate regions showing a relatively low nitrogen concentration, connection resistances between the conductor layers and plugs can be reduced. As a result, the reliability of the semiconductor apparatus can be improved.

Thus, the use of the semiconductor apparatus according to the present exemplary embodiment enables performance enhancement of the semiconductor apparatus. For example, the semiconductor apparatus can be mounted on transportation equipment and capture an image outside the transportation equipment or measure an outside environment with excellent reliability. In manufacturing and selling transportation equipment, a determination to mount the semiconductor apparatus according to the present exemplary embodiment on the transportation equipment is, therefore, advantageous in enhancing performance of the transportation equipment itself.

Modifications may be made to the foregoing exemplary embodiment as appropriate without departing from the technical concept thereof. The disclosure of the present exemplary embodiment is not limited to what are explicitly described herein, and includes all items comprehensible from the specification document and the drawings accompanying the specification document.

While the present disclosure has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2019-084744, filed Apr. 25, 2019, which is hereby incorporated by reference herein in its entirety.

What is claimed is:

1. A semiconductor apparatus comprising:
a semiconductor layer;
a substrate, the semiconductor layer and the substrate being stacked on each other;
a first conductor layer between the semiconductor layer and the substrate, the first conductor layer containing copper and including a first conductor portion;
a first insulator layer between the semiconductor layer and the substrate, the first insulator layer covering the first conductor layer and including a first insulator portion;
a second conductor layer between the semiconductor layer and the substrate, the second conductor layer containing copper and including a second conductor portion; and
a second insulator layer between the semiconductor layer and the substrate, the second insulator layer covering the second conductor layer and including a second insulator portion,
wherein a distance between the first conductor portion and the first insulator portion is smaller than a thickness of the first conductor layer,
wherein a first region containing silicon and copper is disposed between the first conductor portion and the first insulator portion,
wherein a distance between the second conductor portion and the second insulator portion is smaller than a thickness of the second conductor layer,
wherein a second region containing silicon and copper is disposed between the second conductor portion and the second insulator portion, and
wherein the first region has a maximum nitrogen concentration which is higher than that of the second region.

2. The semiconductor apparatus according to claim 1,
wherein the semiconductor layer has a thickness which is smaller than that of the substrate, and
wherein a distance between the substrate and the first conductor layer is smaller than that between the substrate and the second conductor layer.

3. The semiconductor apparatus according to claim 1, wherein a distance between the semiconductor layer and the first conductor layer is greater than that between the semiconductor layer and the second conductor layer and smaller than a thickness of the semiconductor layer.

4. The semiconductor apparatus according to claim 1, further comprising:
a third conductor layer between the semiconductor layer and the substrate, the third conductor layer containing copper and including a third conductor portion;
a third insulator layer between the semiconductor layer and the substrate, the third insulator layer covering the third conductor layer and including a third insulator portion;

a fourth conductor layer between the semiconductor layer and the substrate, the fourth conductor layer containing copper and including a fourth conductor portion; and a fourth insulator layer between the semiconductor layer and the substrate, the fourth insulator layer covering the fourth conductor layer and including a fourth insulator portion, wherein a distance between the substrate and the third conductor layer and a distance between the substrate and the fourth conductor layer are smaller than a distance between the substrate and the first conductor layer and a distance between the substrate and the second conductor layer, wherein a distance between the third conductor portion and the third insulator portion is smaller than a thickness of the third conductor layer, wherein a third region containing silicon and copper is disposed between the third conductor portion and the third insulator portion, wherein a distance between the fourth conductor portion and the fourth insulator portion is smaller than a thickness of the fourth conductor layer, wherein a fourth region containing silicon and copper is disposed between the fourth conductor portion and the fourth insulator portion, and wherein the third region has a maximum nitrogen concentration which is higher than that of the fourth region.

5. The semiconductor apparatus according to claim 4, wherein a distance between the semiconductor layer and the third conductor layer is smaller than that between the semiconductor layer and the fourth conductor layer.

6. The semiconductor apparatus according to claim 1,
wherein the semiconductor layer includes a first metal-oxide-semiconductor (MOS) transistor,
wherein the substrate includes a second MOS transistor, and
wherein the second MOS transistor has a gate length which is smaller than that of the first MOS transistor.

7. The semiconductor apparatus according to claim 1, wherein the semiconductor layer includes a photoelectric conversion unit.

8. The semiconductor apparatus according to claim 1, wherein nitrogen and silicon are bonded in the first region.

9. The semiconductor apparatus according to claim 1, wherein copper and silicon are bonded in the first region.

10. The semiconductor apparatus according to claim 1, wherein the first and second insulator layers contain silicon and carbon.

11. The semiconductor apparatus according to claim 1, wherein the maximum nitrogen concentration of the first region is higher than a nitrogen concentration of the first conductor portion and a nitrogen concentration of the first insulator portion.

12. The semiconductor apparatus according to claim 1,
wherein the first region includes a first portion where a silicon concentration and a copper concentration are equal,
wherein the second region includes a second portion where a silicon concentration and a copper concentration are equal, and
wherein the first portion has a nitrogen concentration which is higher than that of the second portion.

13. The semiconductor apparatus according to claim 12, wherein the nitrogen concentration of the first portion is lower than the silicon concentration and the copper concentration of the first portion.

14. The semiconductor apparatus according to claim 1,
wherein the maximum nitrogen concentration of the first region is 1.0 at % or more, and less than 10 at %, and
wherein the maximum nitrogen concentration of the second region is less than 1.0 at %.

15. The semiconductor apparatus according to claim 1, wherein the second region does not contain nitrogen.

16. Equipment comprising:
the semiconductor apparatus according to claim 1; and
a signal processing apparatus connected to the semiconductor apparatus.

17. A semiconductor apparatus comprising:
a semiconductor substrate;
a dielectric member on the semiconductor substrate, the dielectric member being made of a silicon compound including at least either nitrogen or carbon; and
a first conductor layer between the semiconductor substrate and the dielectric member, the first conductor layer containing copper and including a first conductor portion;
a first insulator layer between the semiconductor substrate and the dielectric member, the first insulator layer covering the first conductor layer and including a first insulator portion;
a second conductor layer between the semiconductor substrate and the dielectric member, the second conductor layer containing copper and including a second conductor portion; and
a second insulator layer between the semiconductor substrate and the dielectric member, the second insulator layer covering the second conductor layer and including a second insulator portion,
wherein the dielectric member has an uneven first surface facing toward the semiconductor substrate,
wherein a second surface of the dielectric member opposite to the first surface is flatter than the first surface,
wherein a distance between the first conductor portion and the first insulator portion is smaller than a thickness of the first conductor layer, and a first region containing silicon and copper is disposed between the first conductor portion and the first insulator portion,
wherein a distance between the second conductor portion and the second insulator portion is smaller than a thickness of the second conductor layer, and a second region containing silicon and copper is disposed between the second conductor portion and the second insulator portion, and
wherein the first region has a maximum nitrogen concentration which is higher than that of the second region.

18. The semiconductor apparatus according to claim 17,
wherein a distance between the second surface and the first conductor layer is smaller than that between the second surface and the second conductor layer, and
wherein a difference in height of the second surface of the dielectric member is less than $1/10$ of the first surface.

19. The semiconductor apparatus according to claim 17, wherein the dielectric member includes a portion surrounded by the first insulator layer.

20. The semiconductor apparatus according to claim 17,
wherein the semiconductor substrate includes a photoelectric conversion unit, and
wherein the dielectric member includes a light guide portion over the photoelectric conversion unit.

* * * * *